United States Patent
Hoshino

(10) Patent No.: US 9,324,734 B2
(45) Date of Patent: Apr. 26, 2016

(54) SEMICONDUCTOR DEVICE HAVING SEMICONDUCTOR LAYERS WITH DIFFERENT THICKNESSES

(71) Applicant: RENESAS ELECTRONICS CORPORATION, Kawasaki-shi, Kanagawa (JP)

(72) Inventor: Yutaka Hoshino, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/593,070

(22) Filed: Jan. 9, 2015

(65) Prior Publication Data

US 2015/0155300 A1   Jun. 4, 2015

Related U.S. Application Data

(62) Division of application No. 13/409,728, filed on Mar. 1, 2012, now Pat. No. 8,962,418.

(30) Foreign Application Priority Data

Mar. 10, 2011   (JP) .................................. 2011-053002

(51) Int. Cl.
| | |
|---|---|
| H01L 27/01 | (2006.01) |
| H01L 27/12 | (2006.01) |
| H01L 27/105 | (2006.01) |
| H01L 27/092 | (2006.01) |
| H01L 27/108 | (2006.01) |
| H01L 29/51 | (2006.01) |
| H01L 21/8234 | (2006.01) |
| H01L 21/8238 | (2006.01) |
| H01L 29/78 | (2006.01) |

(52) U.S. Cl.
CPC ........ H01L 27/1203 (2013.01); H01L 27/0922 (2013.01); H01L 27/105 (2013.01); H01L 27/10894 (2013.01); H01L 29/518 (2013.01); H01L 29/78 (2013.01); *H01L 21/823412* (2013.01); *H01L 21/823418* (2013.01); *H01L 21/823807* (2013.01); *H01L 29/7833* (2013.01)

(58) Field of Classification Search
CPC ... H01L 27/1203; H01L 29/78; H01L 29/518; H01L 29/7833; H01L 21/823418; H01L 21/823807; H01L 21/823412; H01L 27/0922; H01L 27/105; H01L 27/10894; H01L 21/76264
USPC .......................... 257/347, 351, 354, 506, 510
See application file for complete search history.

(56) References Cited

U.S. PATENT DOCUMENTS

| | | | | |
|---|---|---|---|---|
| 6,252,281 | B1 * | 6/2001 | Yamamoto | ........ H01L 21/76264 257/296 |
| 6,314,021 | B1 | 11/2001 | Maeda et al. | |

(Continued)

FOREIGN PATENT DOCUMENTS

| | | |
|---|---|---|
| JP | 2001-339071 A | 12/2001 |
| JP | 2001-351995 A | 12/2001 |
| JP | 2007-150360 A | 6/2007 |
| JP | 2008-186978 A | 8/2008 |
| JP | 2009-170590 A | 7/2009 |

*Primary Examiner* — Shouxiang Hu
(74) *Attorney, Agent, or Firm* — Shapiro, Gabor and Rosenberger, PLLC

(57) ABSTRACT

A semiconductor device has a first element region, a second element region, and a first isolation region in a thin film region and a third element region, a fourth element region, and a second isolation region in a thick film region. It is manufactured with step (a) of providing a substrate having a silicon layer formed via an insulating layer, step (b) of forming element isolation insulating films in the silicon layer in the first isolation region and the second isolation region of the substrate step (c) of forming a hard mask in the thin film region, step (d) of forming silicon films over the silicon layer exposed from the hard mask in the third element region and the fourth element region, and step (e) of forming element isolation insulating films between the silicon films in the third element region and the fourth element region.

7 Claims, 24 Drawing Sheets

(56) References Cited

U.S. PATENT DOCUMENTS

| | | |
|---|---|---|
| 6,835,983 B2 | 12/2004 | Ning et al. |
| 6,953,979 B1 | 10/2005 | Yamaguchi et al. |
| 7,193,272 B2 | 3/2007 | Hirano et al. |
| 7,238,989 B2 | 7/2007 | Yeo et al. |
| 7,910,423 B2 | 3/2011 | Ohara |
| 8,390,026 B2 | 3/2013 | Winstead et al. |
| 2008/0111155 A1* | 5/2008 | Capasso .......... H01L 21/823807 257/192 |
| 2010/0084709 A1* | 4/2010 | Tsuchiya ........ H01L 21/823878 257/347 |
| 2010/0301416 A1* | 12/2010 | Hoentschel ..... H01L 21/823807 257/351 |

* cited by examiner

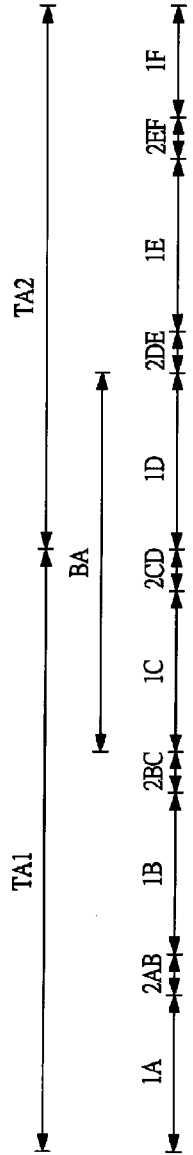
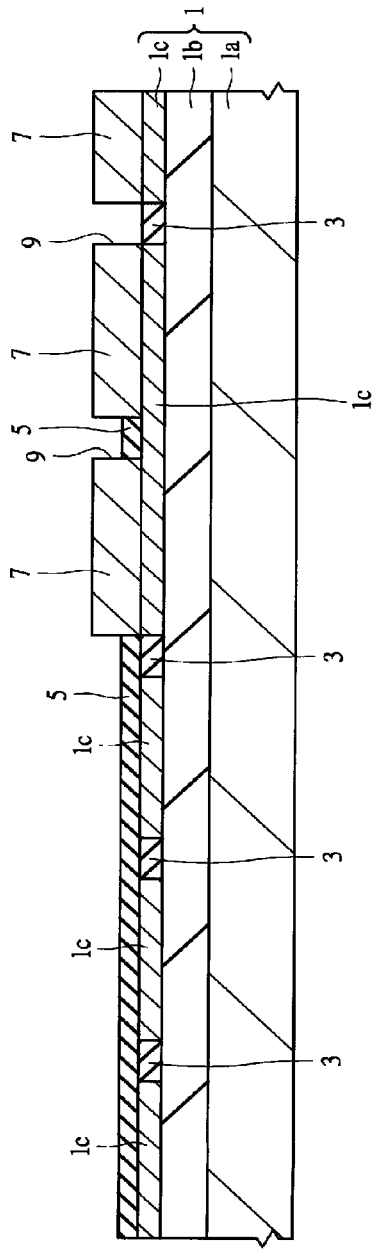
FIG. 4

SEMICONDUCTOR DEVICE HAVING SEMICONDUCTOR LAYERS WITH DIFFERENT THICKNESSES

CROSS-REFERENCE TO RELATED APPLICATION

The disclosure of Japanese Patent Application No. 2011-53002 filed on Mar. 10, 2011 including the specification, drawings and abstract is incorporated herein by reference in its entirety.

BACKGROUND

The present invention relates to a semiconductor device, and in particular, relates to a technique effective to be applied to a semiconductor device having semiconductor elements formed in semiconductor layers with different thicknesses.

Recently, in a mobile communication device (a mobile phone), to handle transmission and reception signals compliant with a plurality of different frequency bands and different modulation systems, one antenna is shared to transmit and receive these transmission and reception signals and connection with the antenna is switched by an antenna switching circuit. This antenna switching circuit may include an metal-insulator-semiconductor field effect transistor (MISFET) formed over an silicon on insulator (SOI) substrate.

Patent Document 1 (Japanese Patent Laid-Open No. 2008-186978) discloses a technique for manufacturing a semiconductor device to control occurrence of variation in a thickness of a nitride film near a trench, by etching when deeply digging the trench in a depth of perfect isolation to control variation in an element isolation film. Specifically, a manufacturing method of a semiconductor device having the following steps is disclosed. This manufacturing method of a semiconductor device has the steps of (a) forming a plurality of trenches [17] in a depth of partial isolation on an SOI substrate [11] with a nitride film [13] formed on its upper surface, and (b) forming an inner wall oxide film [19] in an extremely thin film state by oxidizing an inner wall of each trench [17]. Further, it has the steps of (c) forming a resist [21] over the SOI substrate [11] by exposing a specific trench [17a] among the trenches [17] and also filling the rest of the trenches [17b], and (d) deeply digging the specific trench [17a] in a depth of perfect isolation by etching a bottom portion of the specific trench [17a] using the resist [21] as a mask (refer to FIGS. 3 and 4).

Patent Document 2 (Japanese Patent Laid-Open No. 2001-339071) discloses a technique for forming a perfectly isolated portion [23] reaching an upper surface of an insulating layer [3] on an element isolation insulating film [5] of an SOI substrate [1] below a power wiring [21] (refer to FIG. 2).

Patent Document 3 (Japanese Patent Laid-Open No. 2009-170590) discloses a technique for accurate element isolation between a plurality of types of transistors, in a semiconductor device having the plurality of types of transistors formed in SOI layers with different thicknesses. Specifically, this document discloses a semiconductor device in which the SOI layer [3] has a thick film SOI region [101] and a thin film SOI region [102], an upper layer portion of the thick film SOI region [101] is formed with an epitaxial SOI layer, and an SOI film thickness [t1] of the thick film SOI region [101] is thicker than an SOI film thickness [t2] of the thin film SOI region [102] by a film thickness of this epitaxial SOI layer. In addition, a space between the thick film SOI region [101] and the thin film SOI region [102] is element-isolated by a perfectly isolated oxide film [10f], and a space between adjacent transistors is element-isolated by a partially isolated oxide film [10p] within the thick film SOI region [101] and within the thin film SOI region [102]. This document discloses a semiconductor device in which upper surfaces of the perfectly isolated oxide film [10f] and the partially isolated oxide film [10p] are formed higher than the upper surface of the SOI layer [3] in the thick film SOI region [101] and the thin film SOI region [102] (refer to FIGS. 1 and 5).

Patent Document 4 (Japanese Patent Laid-Open No. 2007-150360) discloses a technique related to a semiconductor device having an SOI structure. In addition, the paragraph [0068], with reference to FIG. 26, discloses a step of exposing a surface of an embedded oxide film [2] by performing silicon etching on an SOI layer [3] using a resist [49] as a mask to remove the SOI layer [3] not having the resist [49] formed in its upper portion and including the SOI layer [3] below a central portion of a bottom surface of a partial trench [44A]. Further, the paragraph [0069], with reference to FIG. 27, discloses a step of forming a structure having a partial oxide film [31] (and an SOI layer [3] which is below the partial oxide film [31]) and an oxide film [33] (and an SOI layer [3] which is below the partial oxide film [33]) selectively formed by depositing an oxide film and polishing it partway of a nitride film [42] by a CMP process in a technique similar to normal trench isolation, and then, by removing the nitride film [42] and the oxide film [41].

Patent Document 5 (Japanese Patent Laid-Open No. 2001-351995) discloses a semiconductor device in which an element isolation insulating film [16] is formed instead of the element isolation insulating film [5] having a structure shown in FIG. 13 at the boundary portion between a memory cell array portion and a low-voltage logic circuit portion. This element isolation insulating film [16] has a perfectly isolated portion [40] reaching an upper surface of a BOX layer [3] in a part of a bottom surface (refer to FIG. 15).

In this section, insides of the [parenthesis] denote reference numerals described in each Patent Document, and the drawing numbers denote the drawing numbers described in each Patent Document.

SUMMARY

The present inventor is engaged in research and development on a semiconductor device used for the mobile communication device described.

Among all, the inventor examines improvement in the performance of a semiconductor device having the antenna switching circuit formed using an SOI substrate.

Although the antenna switching circuit is an important element in the mobile communication device, various elements are used in the mobile communication device as described later in detail.

Forming these various elements over an identical SOI substrate is a useful technique, and is a very effective technique in terms not only of the improvement in properties of the semiconductor device but also of reduction in area, weight, power consumption, and cost of the mobile communication device. In addition, a semiconductor device having various elements formed over an identical SOI substrate is strongly demanded.

The present invention has been made in view of the above circumstances and provides a manufacturing method of a semiconductor device to form a semiconductor device with good properties over an SOI substrate. In particular, it provides a manufacturing method of a semiconductor device in which not only a thin film semiconductor region but also a thick film semiconductor region is provided over an SOI substrate to form different semiconductor elements in these regions.

In addition, it also provides improvement in properties of the semiconductor device formed on the SOI substrate.

The other purposes and the new feature of the present invention will become clear from the description of the present specification and the accompanying drawings.

The following explains briefly the outline of a typical invention among the inventions disclosed in the present application.

A manufacturing method of a semiconductor device shown in a typical embodiment among the inventions disclosed in the present application is a manufacturing method of a semiconductor device, which includes a thin film region having a first semiconductor film with a first film thickness and a thick film region having a second semiconductor film with a second film thickness thicker than the first film thickness. In addition, it is a manufacturing method of a semiconductor device, which has a first element region, a second element region, and a first isolation region for isolating between the first element region and the second element region, formed in the thin film region; and has a third element region, a fourth element region, and a second isolation region for isolating between the third element region and the fourth element region, formed in the thick film region. The method includes the steps of (a) providing a substrate having the first semiconductor film with the first film thickness formed over a supporting substrate via a first insulating film; and (b) forming a second insulating film in the first semiconductor film with the first film thickness in the first isolation region and the second isolation region of the substrate. Further, it includes the steps of (c) forming a third insulating film in the thin film region; (d) forming third semiconductor films over the first semiconductor film with the first film thickness in the third element region and the fourth element region exposed from the third insulating film; and (e) forming a fourth insulating film between the third semiconductor films in the third element region and the fourth element region.

A semiconductor device shown in a typical embodiment among the inventions disclosed in the present application includes a first element region, a second element region, and a first isolation region including a first insulating film isolating between the first element region; the second element region; and a third element region; a fourth element region; and a second isolation region including a second insulating film isolating between the third element region and the fourth element region. Further, it includes a fifth element region located between the second element region and the fourth element region; and a third isolation region including a third insulating film isolating between the fifth element region and the fourth element region. Furthermore, the first element region and the second element region have a first semiconductor film with a first film thickness disposed over a fourth insulating film; and the third element region, the fourth element region, and the fifth element region have a second semiconductor film with a second film thickness thicker than the first film thickness disposed over the fourth insulating film. The third insulating is thicker than the first insulating film and thinner than the second insulating film.

In accordance with a manufacturing method of a semiconductor device shown in the following typical embodiment among the inventions disclosed in the present application, it is possible to form a semiconductor device with good properties. Such a semiconductor device with good properties can also be formed in simple steps.

In addition, in accordance with a semiconductor device shown in the following typical embodiment among the inventions disclosed in the present application, it is possible to improve properties of a semiconductor device.

BRIEF DESCRIPTION OF THE DRAWINGS

FIG. 4 is a cross-sectional view of the major portion showing steps of manufacturing a semiconductor device in accordance with Embodiment 1, and is a cross-sectional view of the major portion showing steps of manufacturing a semiconductor device following FIG. 3.

DETAILED DESCRIPTION

Figure 1:
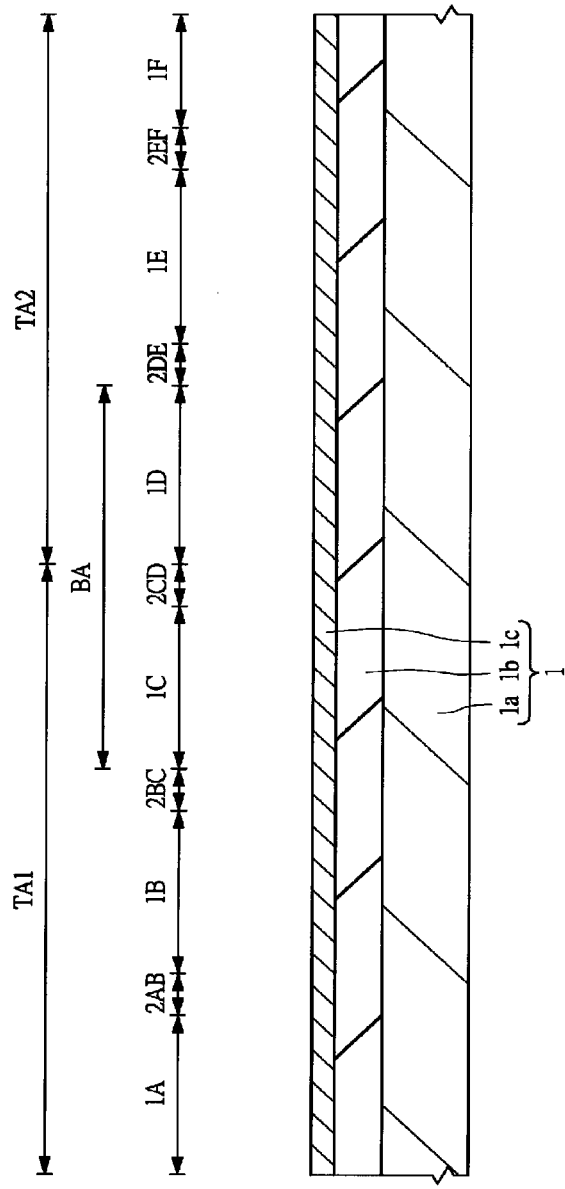
FIG. 1 is a cross-sectional view of the major portion showing steps of manufacturing a semiconductor device in accordance with Embodiment 1.

The following embodiments will be explained, divided into plural sections or embodiments, if necessary for convenience. Except for the case where it shows clearly in particular, they are not mutually unrelated and one has relationships such as a modification, an application, detailed explanation, and a supplementary explanation of some or entire of another. In the following embodiments, when referring to the number of elements (including a number, a numeric value, an amount, and a range), they may be not restricted to the specific number but may be greater or smaller than the specific number, except for the case where they are clearly specified in particular and where they are clearly restricted to a specific number theoretically.

Furthermore, in the following embodiments, an element (including an element step) is not necessarily indispensable, except for the case where it is clearly specified in particular and where it is considered to be clearly indispensable from a theoretical point of view. Similarly, in the following embodiments, when shape and position relationship of an element are referred to, what resembles or is similar to the shape substantially shall be included, except for the case where it is clearly specified in particular and where it is considered to be clearly not right from a theoretical point of view. This statement also applies to the number (including a number, a numeric value, an amount, and a range) described above.

A detailed description is given below to embodiments of the present invention based on the drawings. In all the drawings for explaining embodiments, the same or related symbol is attached to the member having the same function, and the repeated explanation is omitted. In addition, in the following embodiments, explanation for the same or similar parts is not repeated as a principle other than when particularly necessary.

In the drawings used in embodiments, to make a drawing intelligible, hatching may be omitted even if it is a cross-sectional view. In addition, to make a drawing intelligible, hatching may be attached even if it is a plan view.

Embodiment 1

With reference to the drawings, a structure and a manufacturing method of a semiconductor device of the present embodiment are explained below in detail. FIGS. 1 to 17 are cross-sectional views of the major portion showing steps of manufacturing a semiconductor device in accordance with the present embodiment.

[Explanation on Structure]

Figure 16:
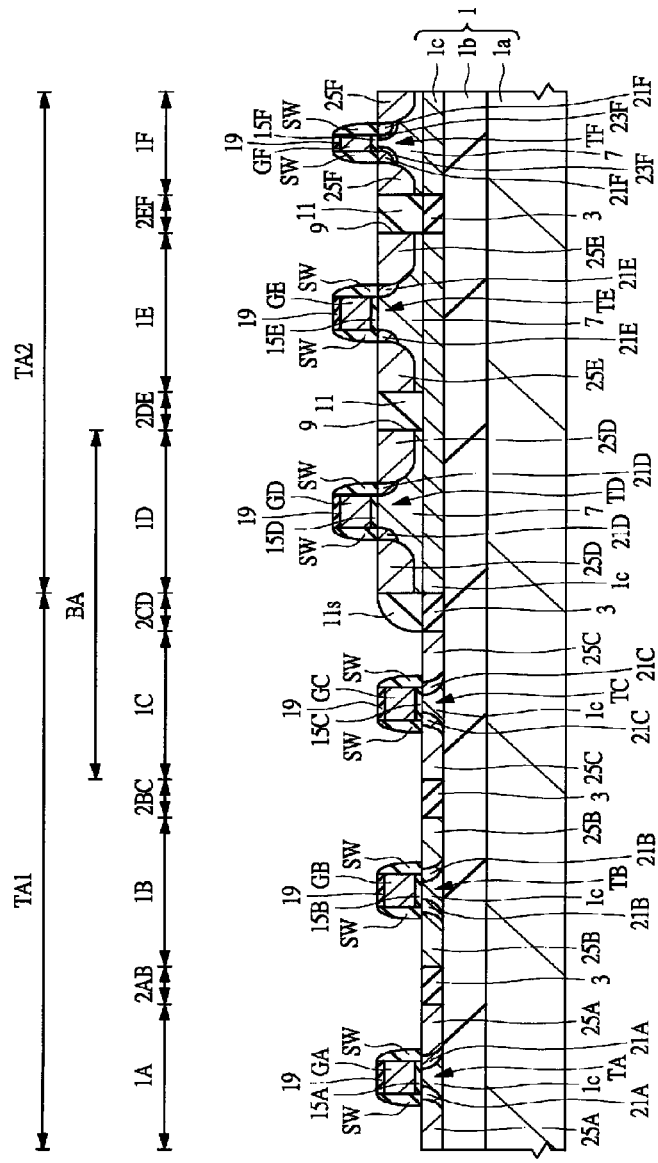
FIG. 16 is a cross-sectional view of the major portion showing steps of manufacturing a semiconductor device in accordance with Embodiment 1, and is a cross-sectional view of the major portion showing steps of manufacturing a semiconductor device following FIG. 15.

Firstly, with reference to FIG. 16, which is one drawing among the cross-sectional views of the major portion showing steps of manufacturing a semiconductor device in accordance with the present embodiment, a characteristic structure of the semiconductor device in accordance with the present embodiment is explained.

A semiconductor device in accordance with the present embodiment has a plurality of Metal-Insulator-Semiconductor Field Effect Transistors (MISFETs) TA, TB, TC, TD, TE, and TF formed on an SOI substrate 1 having a thin film region TA1 and a thick film region TA2.

In the thin film region TA1, MISFETs TA, TB, and TC are formed in a silicon layer (thin film semiconductor region) 1c of the SOI substrate 1. In the thick film region TA2, MISFETs TD, TE, and TF are formed in a silicon film (semiconductor region) 7 disposed over the silicon layer (thin film semiconductor region) 1c of the SOI substrate 1. The silicon layer (thin film semiconductor region) 1c of the SOI substrate 1 is used as an element region in the thin film region TA1. The silicon film 7 (or a laminated film of the silicon film 7 and the silicon layer 1c) over the SOI substrate 1 is used as an element region in the thick film region TA2.

In the thin film region TA1, a region to form the MISFET TA is defined as an element region 1A, a region to form the MISFET TB as an element region 1B, and a region to form the MISFET TC as an element region 1C.

In the thick film region TA2, a region to form the MISFET TD is defined as an element region 1D, a region to form the MISFET TE as an element region 1E, and a region to form the MISFET TF as an element region 1F.

In addition, a region adjacent to the boundary between the thick film region TA2 and the thin film region TA1 (the element regions 1C and 1D) may be referred to as a boundary region BA.

Each of the MISFETs TA, TB, TC, TD, TE, and TF is explained below.

The MISFET TA is formed on the thin film region (SOI region) TA1 and is an n-channel type MISFET in which source and drain regions 21A and 25A reach an insulating layer (embedded insulating layer, BOX) 1b. It is a fully depleted n-channel type MISFET. This MISFET TA is used as an MISFET for an antenna switch. In addition, this MISFET TA has a gate electrode GA disposed via a gate insulating film 15A over the silicon layer (thin film semiconductor region) 1c and the source and drain regions 21A and 25A of an LDD structure disposed in the silicon layer 1c on both sides of the gate electrode GA. The source and drain regions are formed by an n⁻-type semiconductor region (low concentration n-type impurity region) 21A and an n⁺-type semiconductor region (high concentration n-type impurity region) 25A. The n⁻-type semiconductor region 21A has an n-type impurity concentration lower than that of the n⁺-type semiconductor region 25A.

The MISFET TB is formed on the thin film region (SOI region) TA1 and is a p-channel type MISFET in which source and drain regions 21B and 25B reach an insulating layer (embedded insulating layer, BOX) 1b. It is a fully depleted p-channel type MISFET. This MISFET TB is used as an MISFET for an antenna switch. In addition, this MISFET TB has a gate electrode GB disposed via a gate insulating film 15B over the silicon layer (thin film semiconductor region) 1c and the source and drain regions 21B and 25B of an LDD structure disposed in the silicon layer 1c on both sides of the gate electrode GB. The source and drain regions are formed by a p⁻-type semiconductor region (low concentration p-type impurity region) 21B and a p⁺-type semiconductor region (high concentration p-type impurity region) 25B. The p⁻-type semiconductor region 21B has a p-type impurity concentration lower than that of the p⁺-type semiconductor region 25B.

The MISFET TC is formed on the thin film region (SOI region) TA1 and is a n-channel type MISFET in which source and drain regions 21C and 25C reach an insulating layer (embedded insulating layer, BOX) 1b. It is a fully depleted n-channel type MISFET. Although a region to form this MISFET TC is in the thin film region TA1, it is located in a region (boundary region BA) adjacent to the boundary with the thick film region TA2 described later. The MISFET TC formed on the region can be used as an MISFET for an analog circuit, more specifically as an MISFET for an electro-static discharge (ESD) circuit. An ESD circuit is a circuit to prevent breakdown of a semiconductor element due to electrostatic discharge. The MISFET TC has a gate electrode GC disposed via a gate insulating film 15C over the silicon layer (thin film semiconductor region) 1c and the source and drain regions 21C and 25C of an LDD structure disposed in the silicon layer 1c on both sides of the gate electrode GC. The source and drain regions are formed by an n⁻-type semiconductor region (low concentration n-type impurity region) 21C and an n⁺-type semiconductor region (high concentration n-type impurity region) 25C. The n⁻-type semiconductor region 21C has an n-type impurity concentration lower than that of the n⁺-type semiconductor region 25C.

The MISFET TD is formed on the thick film region (bulk region) TA2 and is an n-channel type MISFET in which source and drain regions 21D and 25D do not reach an insulating layer (embedded insulating layer, BOX) 1b. Below the source and drain regions 21D and 25D, the insulating layer (embedded insulating layer, BOX) 1b is located via the silicon film (semiconductor region) 7 and the silicon layer (thin film semiconductor region) 1c. Although a region to form this MISFET TD is in the thick film region TA2, it is located in a region (boundary region BA) adjacent to the boundary with the thin film region TA1 described later. The MISFET TD formed on the region can be used as an MISFET for an analog circuit, more specifically as an MISFET for an ESD circuit. This MISFET TD has a gate electrode GD disposed via a gate insulating film 15D over the silicon layer (thin film semiconductor region) 1c and the source and drain regions 21D and 25D of an LDD structure disposed in the silicon layer (thin film semiconductor region) 1c on both sides of the gate electrode GD. The source and drain regions are formed by an n⁻-type semiconductor region (low concentration n-type impurity region) 21D and an n⁺-type semiconductor region (high concentration n-type impurity region) 25D. The n⁻-type semiconductor region 21D has an n-type impurity concentration lower than that of the n⁺-type semiconductor region (high concentration n-type impurity region) 25D.

The MISFET TE is formed on the thick film region (bulk region) TA2 and is an n-channel type MISFET in which source and drain regions 21E and 25E do not reach an insulating layer (embedded insulating layer, BOX) 1b. Below the source and drain regions 21E and 25E, the insulating layer (embedded insulating layer, BOX) 1b is located via the silicon film (semiconductor region) 7 and the silicon layer (thin film semiconductor region) 1c. The MISFET TE can be used as an MISFET for an analog circuit. This MISFET TE has a gate electrode GE disposed via a gate insulating film 15E over the silicon film (semiconductor region) 7 and the source and drain regions 21E and 25E of an LDD structure disposed in the silicon film (semiconductor region) 7 on both sides of the gate electrode GE. The source and drain regions include an n⁻-type semiconductor region (low concentration n-type impurity region) 21E and an n⁺-type semiconductor region (high concentration n-type impurity region) 25E. The n⁻-type semiconductor region 21E has an n-type impurity concentration lower than that of the n⁺-type semiconductor region 25E.

The MISFET TF is formed on the thick film region (bulk region) TA2 and is an n-channel type MISFET in which source and drain regions 21F and 25F do not reach an insulating layer (embedded insulating layer, BOX) 1b. Below the source and drain regions 21F and 25F, the insulating layer (embedded insulating layer, BOX) 1b is located via the silicon film (semiconductor region) 7 and the silicon layer (thin film semiconductor region) 1c. The MISFET TF can be used as an MISFET for a digital circuit. This MISFET TF has a gate electrode GF disposed via a gate insulating film 15F over the silicon film (semiconductor region) 7 and the source and drain regions 21F and 25F of an LDD structure disposed in the silicon film (semiconductor region) 7 on both sides of the gate electrode GF. The source and drain regions are formed by an n⁻-type semiconductor region (low concentration n-type impurity region) 21F and an n⁺-type semiconductor region (high concentration n-type impurity region) 25F. The n⁻-type semiconductor region 21F has an n-type impurity concentration lower than that of the n⁺-type semiconductor region 25F.

An MISFET for a digital circuit characteristically may have a relatively short gate length (channel length) and have a halo region 23F to reduce a short channel effect.

Specifically, the gate length of the MISFET TF is shorter than that of the MISFET TE. The gate length of the MISFET TF is shorter than the gate length of the MISFET TD. The gate length of the MISFET TF is shorter than that of the MISFET TC. The gate length of the MISFET TF is shorter than that of the MISFET TB. The gate length of the MISFET TF is shorter than that of the MISFET TA.

The halo region 23F is an impurity region disposed below the low concentration impurity region (the n⁻-type semiconductor region 21F) of the source and drain regions 21F and 25F in the LDD structure. The conductivity type of the impurities is opposite to that of the source and drain regions (the p-type). The p-type halo region 23F controls diffusion of the impurities from the source and drain regions 21F and 25F of the MISFET TF to the channel region to control the short channel effect.

In addition, compared with the MISFETs TD and TE for an analog circuit, the MISFET TF for a digital circuit has a small concentration difference between the n⁻-type semiconductor region (low concentration n-type impurity region) 21F and the n⁺-type semiconductor region (high concentration n-type impurity region) 25F. The n⁻-type semiconductor region 21F has a concentration of one tenth or more of that of the n⁺-type semiconductor region 25F, whereas the n⁺-type semiconductor region 25D of an MISFET (TD) for an analog circuit often has a concentration of ten times or more of that of the n⁻-type semiconductor region 21D.

Subsequently, the following explains isolation between the element regions 1A, 1B, 1C, 1D, 1E, and 1F on which each of the MISFETs TA, TB, TC, TD, TE, and TF is formed.

The space (isolation region 2AB) between the element region 1A in which the MISFET TA is disposed and the element region 1B in which the MISFET TB is disposed is element-isolated by an element isolation insulating film 3 provided in the silicon layer (semiconductor region) 1c.

The space (isolation region 2BC) between the element region 1B in which the MISFET TB is disposed and the element region 1C in which the MISFET TC is disposed is element-isolated by an element isolation insulating film 3 provided in the silicon layer (semiconductor region) 1c.

The space (isolation region 2CD) between the element region 1C in which the MISFET TC is disposed and the element region 1D in which the MISFET TD is disposed is element-isolated by an element isolation insulating film 3 provided in the silicon layer (semiconductor region) 1c. On a side wall on an element region 1C side in the element region 1D, a side wall film (side wall insulating film) 11s is disposed.

The space (isolation region 2DE) between the element region 1D in which the MISFET TD is disposed and the element region 1E in which the MISFET TE is disposed is element-isolated by an element isolation insulating film 11 provided between the silicon films (semiconductor regions) 7. The MISFET TD and the MISFET TE are MISFETs for an analog circuit. Few failures due to interference with each other occur. The space between the element region 1D and the element region 1E is partial isolation. This "partial isolation" means element isolation in which the element isolation insulating film 11 does not reach the insulating layer 1b and a semiconductor region, such as the silicon layer 1c, remains below the element isolation insulating film 11.

The space (isolation region 2EF) between the element region 1E in which the MISFET TE is disposed and the element region 1F in which the MISFET TF is disposed is element-isolated by a laminated film of an element isolation insulating film 11 provided between the silicon films (semiconductor regions) 7 and the element isolation insulating film 3 provided in the silicon layer (semiconductor region) 1c. The MISFET TE is an MISFET for an analog circuit and the MISFET TF is an MISFET for a digital circuit. Many failures due to interference with each other occur. The space between the element region 1E and the element region 1F is of perfect isolation. This "perfect isolation" means element isolation in which the element isolation insulating films (11 and 3) reach the insulating layer 1b.

Among the MISFETs TA, TB, TC, TD, TE, and TF in the present embodiment, the MISFETs TA, TB, and TC in which the source and drain regions reach the insulating layer 1b may be referred to as "SOI-MISes" and the MISFETs TD, TE, and TF in which the source and drain regions do not reach the insulating layer 1b as "bulk MISes". An MIS means an "MIS-FET".

In accordance with the semiconductor device of the present embodiment, it is possible to form the thin film region (SOI region) TA1 and the thick film region (bulk region) TA2 over an identical substrate. The SOI-MISes TA, TB, and TC and the bulk MISes TD, TE, and TF can be formed over an identical substrate. In addition, in accordance with the properties of the bulk MISes TD, TE, and TF, the form (partial isolation or perfect isolation) of element isolation between the elements can be made preferable.

Although the SOI-MISes. TA, TB, and TC are disposed in the thin film region (SOI region) TA1 and the bulk MISes TD, TE, and TF are disposed in the thick film region (bulk region) TA2, other elements may also be disposed in these regions.

The following explains properties of an element preferably disposed in the thin film region TA1 and the thick film region TA2.

Because the thin film region TA1 has small parasitic capacitance, properties of high speed operation and RF (Radio Frequency) operation become well. It can be used for various elements requiring these properties. It is possible to form a fully depleted (Fully Depleted Silicon On Insulator (FD-SOI)) MIS, specifically the MISFET for the antenna switching circuit. In addition, because the thin film region TA1 has low voltage resistance and high well resistance (substrate resistance, and resistance in the element region) compared with those in the thick film region TA2, it is possible to form an element for low voltage, specifically an MISFET for low voltage (with a gate voltage of 3.3 V or less) or a micro MISFET having small parasitic capacitance (an MISFET with a gate length of less than 0.35 μm).

Since the thick film region TA2 can have high voltage resistance, it is possible to form an element having high voltage resistance, specifically an MISFET having high voltage resistance to which a high potential (a gate voltage of 3.5 V or more) is applied, and more specifically, the MISFET for an analog circuit. The MISFET having high voltage resistance has a gate insulating film which is relatively as thick as 6 nm or more to maintain the voltage resistance. Besides, as the element having high voltage resistance, an element, such as a laterally diffused MOS (an LDMOS) transistor, can be formed on the thick film region TA2. In addition, it is preferred to form a capacitive element (MIS capacitor) or the like on the thick film region TA2. Embodiment 3 describes the details. In addition, other than the MIS capacitor, a semiconductor element, such as a Schottky Barrier diode and a varactor diode, is formed easier on the thick film region TA2.

In addition, an MISFET including a general analog circuit or logic circuit can also be formed on the thick film region TA2. It is possible to form the MISFET for the logic circuit. As described above, the MISFET including a logic circuit is formed more minutely than the MISFET including an analog circuit. It is possible to form such an MISFET for a micro logic circuit (an MISFET with a gate length of less than 0.3 μm).

On the boundary region (the element region 1C or 1D) between the thin film region TA1 and the thick film region TA2, it is possible to form the MISFET for the ESD circuit (ESD protection circuit), which is an analog circuit.

[Explanation on Manufacturing Method]

Subsequently, with reference to FIGS. 1 to 17, the following explains a manufacturing method of a semiconductor device in accordance with the present embodiment and clarifies a configuration of the semiconductor device more.

<Step of Element Isolation>

First, an SOI substrate 1 in FIG. 1 is provided. The SOI substrate 1 includes a supporting substrate 1a including silicon single crystal (semiconductor film), an insulating layer (embedded insulating layer, BOX) 1b formed over this supporting substrate 1a, and a silicon layer (thin film semiconductor film, thin film semiconductor region) 1c formed over the insulating layer 1b. At this stage, this SOI substrate is almost a circular thin plate (wafer) in a planar view from the upper surface. The silicon layer 1c has a thickness of about from 250 to 20 µm.

Figure 2:
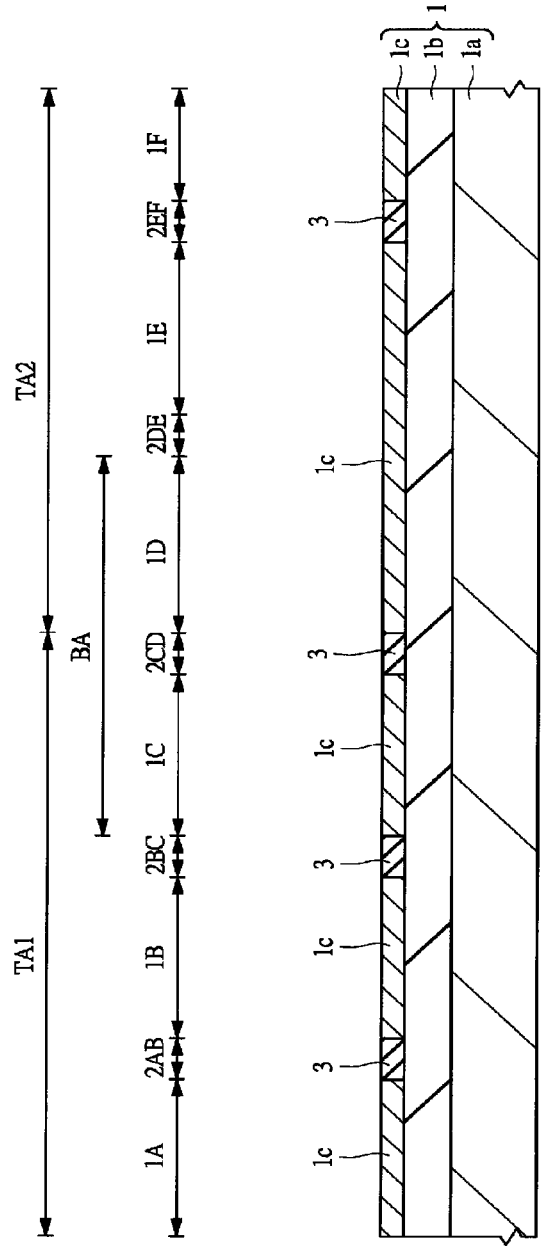
FIG. 2 is a cross-sectional view of the major portion showing steps of manufacturing a semiconductor device in accordance with Embodiment 1, and is a cross-sectional view of the major portion showing steps of manufacturing a semiconductor device following FIG. 1.

Then, as shown in FIG. 2, an element isolation insulating film 3 is formed on the silicon layer 1c of the SOI substrate 1. The element isolation insulating films 3 are formed on the isolation regions 2AB, 2BC, 2CD, and 2EF of the SOI substrate 1. The element isolation insulating films 3 are provided not to let the elements interfere with each other. The element isolation regions can be formed using a "local oxidation of silicon" (LOCOS) method or a shallow trench isolation (STI) method.

In the STI method, the element isolation regions are formed as follows. Using a photolithography technique and an etching technique in the silicon layer 1c of the SOI substrate 1, element isolation grooves are formed on the isolation regions 2AB, 2BC, 2CD, and 2EF. The bottom portions of the element isolation grooves reach the insulating layer 1b. The photolithography technique forms a photoresist film (mask film) in a desired shape by forming a photoresist film over an etched film (the silicon layer 1c) and by exposing and developing the photoresist film. Removing an etched film (the silicon layer 1c) is called etching. Because the etched film (the silicon layer 1c) on the lower layer is removed using the photoresist film as a mask, the etched film can be removed selectively. After the etching step, the photoresist film is removed by an ashing process or the like.

Subsequently, a silicon oxide film is deposited over the SOI substrate 1 using a chemical vapor deposition (CVD) method at a film thickness to the extent of embedding the element isolation grooves and the silicon oxide film outside the element isolation grooves is removed using a chemical mechanical polishing (CMP) method, an etch back method, or the like. This enables to embed a silicon oxide film into the element isolation grooves.

In the LOCOS method, first, using a photolithography technique and an etching technique, a silicon nitride film having openings in the isolation regions 2AB, 2BC, 2CD, and 2EF is formed. Subsequently, the silicon layer 1c is thermally oxidized using the film as a mask to form a silicon oxide film (thermally oxidized film) in the isolation regions 2AB, 2BC, 2CD, and 2EF.

The depth of the element isolation grooves (element isolation insulating films 3) may be a depth to the extent of allowing prevention of the interference between the elements as described above, and the element isolation insulating films 3 do not necessarily have to reach the insulating layer 1b. The element isolation reaching the insulating layer 1b is referred to as "perfect isolation" and the element isolation not reaching the insulating layer 1b and having a semiconductor region, such as the silicon layer 1c, remained below the element isolation is referred to as "partial isolation". The element isolation insulating films 3 may be perfect isolation or may also be partial isolation. In forming the element isolation insulating films 3 by the LOCOS method, they are often partial isolation.

Figure 3:
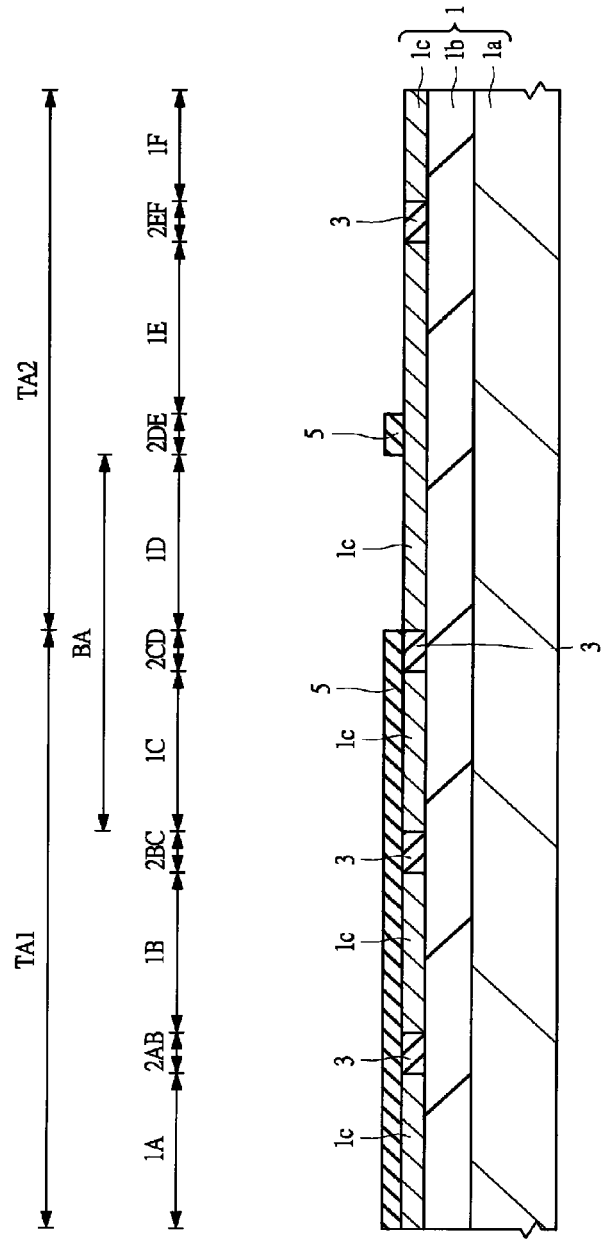
FIG. 3 is a cross-sectional view of the major portion showing steps of manufacturing a semiconductor device in accordance with Embodiment 1, and is a cross-sectional view of the major portion showing steps of manufacturing a semiconductor device following FIG. 2.

Subsequently, as shown in FIG. 3, as a hard mask (mask film) 5 for selective epitaxial growth, an insulating film (third insulating film), such as a silicon oxide film, is deposited over the SOI substrate 1 by a CVD method or the like. The silicon oxide film is selectively removed (patterned) using a photolithography technique and an etching technique. Thus, the hard mask 5 remains only in the thin film region TA1 and in the isolation region 2DE.

Subsequently, as shown in FIG. 4, using the hard mask 5 and the element isolation insulating film 3 in the isolation region 2EF as a mask, the silicon film (semiconductor region) 7 from the silicon layer 1c in the exposed element regions 1D, 1E, and 1F is epitaxially grown. The silicon film 7 has a thickness of about from 100 to 500 nm. By covering, with the hard mask 5, the thin film region TA1 and the regions that may be of partial isolation while forming the element isolation 11 in the thick film region TA2 described later, the silicon film 7 can be epitaxially grown selectively only in the necessary regions (the element regions 1D, 1E, and 1F). This forms a laminated film of the silicon layer 1c and the silicon film 7 in the element regions 1D, 1E, and 1F.

In the thick film region TA2, because the silicon film 7 is not epitaxially grown over the isolation region 2DE covered with the hard mask 5 and the isolation region 2EF in which the element isolation insulating film 3 is exposed, isolation grooves (recesses) 9 are formed in these regions 2DE and 2EF.

By the selective epitaxial growth step, the laminated film (thick film semiconductor region) of the silicon layer 1c and the silicon film 7 is formed on the element regions 1D, 1E, and 1F, and the isolation grooves 9 can be formed on the isolation regions 2DE and 2EF.

Figure 5:
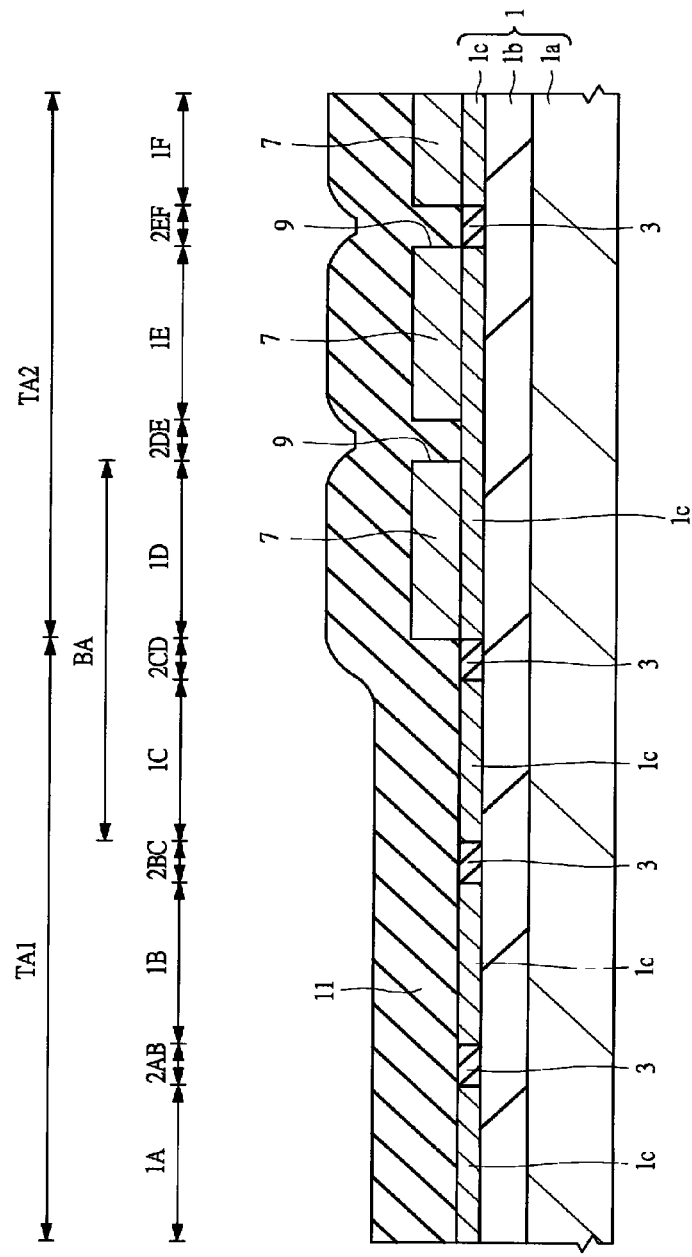
FIG. 5 is a cross-sectional view of the major portion showing steps of manufacturing a semiconductor device in accordance with Embodiment 1, and is a cross-sectional view of the major portion showing steps of manufacturing a semiconductor device following FIG. 4.
Figure 6:
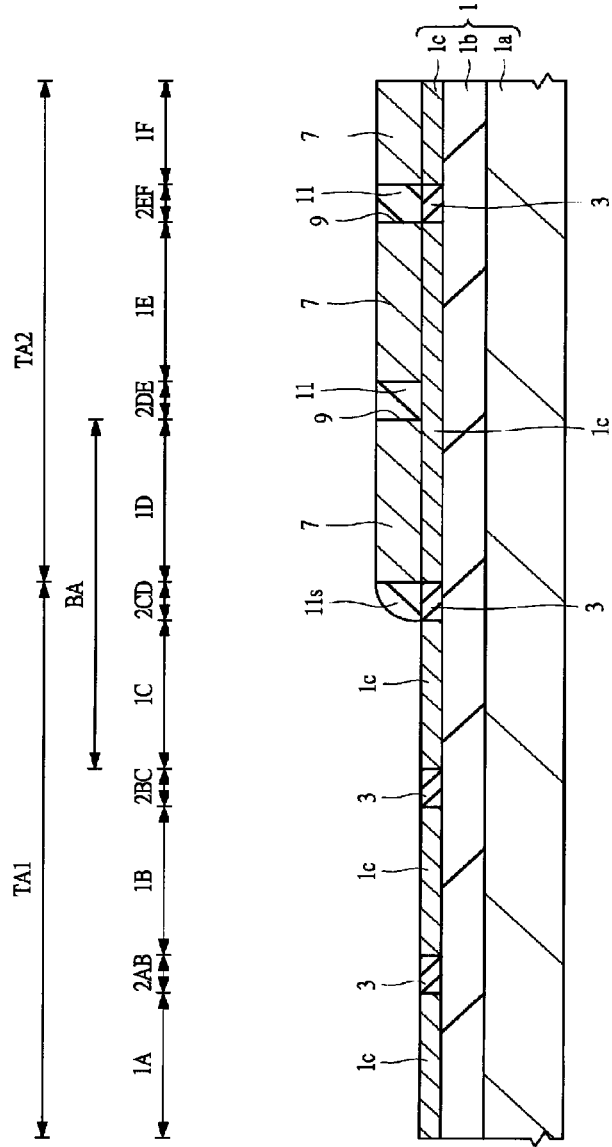
FIG. 6 is a cross-sectional view of the major portion showing steps of manufacturing a semiconductor device in accordance with Embodiment 1, and is a cross-sectional view of the major portion showing steps of manufacturing a semiconductor device following FIG. 5.

Subsequently, after removing the hard mask 5 by etching, element isolation insulating films 11 are formed by embedding an insulating film into the isolation grooves 9. As shown in FIG. 5, the element isolation insulating films 11, such as a silicon oxide film, are deposited over the SOI substrate 1 at a thickness to the extent of embedding the isolation grooves 9 using a CVD method or the like. Also, as shown in FIG. 6, the silicon oxide film outside the isolation grooves 9 is removed by anisotropic etching. This enables to embed a silicon oxide film (element isolation insulating films 11) into the isolation grooves 9.

Similar to the element isolation insulating films 3, the element isolation insulating films 11 may also be formed by removing the silicon oxide film outside the isolation grooves 9 using a CMP method or an etch back method. In the anisotropic etching, a side wall film (side wall insulating film) 11s can be formed on the side wall of the element region 1D on the side of the thin film region TA1 of the silicon film 7.

The difference in level at the boundary between the thin film region TA1 and the thick film region TA2 is diminished by the side wall film 11s. As a result, as described later, in using the element regions 1C and 1D, which are the regions near the boundary between the thin film region TA1 and the thick film region TA2 as the element regions, it is possible to diminish a failure due to the difference in level. It is possible to prevent a residue of a conductive film (polycrystalline silicon film 17 constituting the gate electrode GA, described later) from remaining at the difference in level to become a factor of a defect, such as short circuit between the elements. The element region 1C, the isolation region 2CD, and the element region 1D are called the boundary region BA.

By the above steps, the silicon layer 1c is zoned into a plurality of element regions (1A, 1B, and 1C) by the element isolation insulating films 3, and the laminated film of the silicon layer 1c and the silicon film 7 is zoned into a plurality of element regions (1D, 1E, and 1F) by the laminated films of the element isolation insulating films 3 and 11. Each of the element regions 1A, 1B, 1C, 1D, 1E, and 1F is almost a rectangular region in a planar view from the upper surface, and the element isolation insulating films (including 3, 11, and 11s) are disposed to surround the regions. The element regions may also be referred to as active regions.

<MIS Formation Step>

Subsequently, the MISFETs TA, TB, TC, TD, TE, and TF are formed in each of the element regions 1A, 1B, 1C, 1D, 1E, and 1F. Although a method of forming MISFETs is not limited, they can be formed in the following steps.

Figure 7:
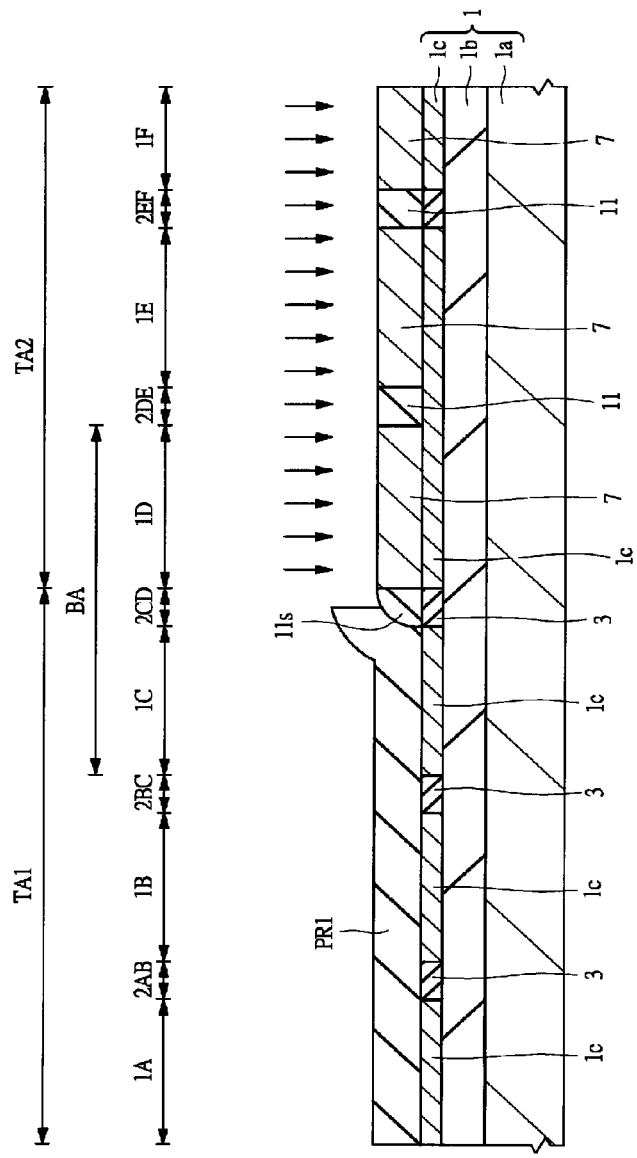
FIG. 7 is a cross-sectional view of the major portion showing steps of manufacturing a semiconductor device in accordance with Embodiment 1, and is a cross-sectional view of the major portion showing steps of manufacturing a semiconductor device following FIG. 6.

First, as shown in FIG. 7, after applying a photoresist film PR1 over the SOI substrate 1, this photoresist film PR1 is subjected to exposure and development processes. Then, openings are formed over the element regions 1D, 1E, and 1F. Subsequently, by an ion implantation method using the photoresist film PR1 as a mask; p-type impurities, such as boron (B), are implanted into the element regions 1D, 1E, and 1F. This determines the channel concentration of the n-channel type MISFETs TD, TE, and TF formed in the element regions 1D, 1E, and 1F. The concentration of impurities to be implanted may also be modified for each of the element regions 1D, 1E, and 1F.

Figure 8:
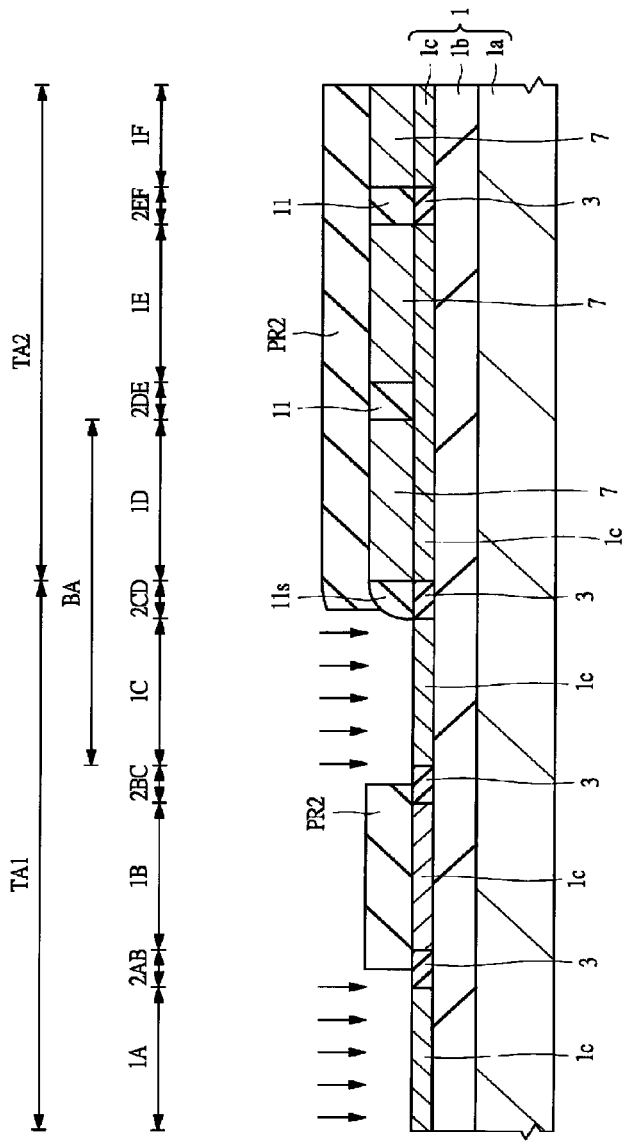
FIG. 8 is a cross-sectional view of the major portion showing steps of manufacturing a semiconductor device in accordance with Embodiment 1, and is a cross-sectional view of the major portion showing steps of manufacturing a semiconductor device following FIG. 7.

Then, after removing the photoresist film PR1, as shown in FIG. 8, a photoresist film PR2 having openings over the element regions 1A and 1C is formed over the SOI substrate 1. Subsequently, by an ion implantation method using the photoresist film PR2 as a mask, p-type impurities, such as boron (B), are implanted into the element regions 1A and 1C. This determines the channel concentration of the n-channel type MISFETs TA and TC formed in the element regions 1A and 1C. The concentration of impurities to be implanted may also be modified for each of the element regions 1A and 1C.

Figure 9:
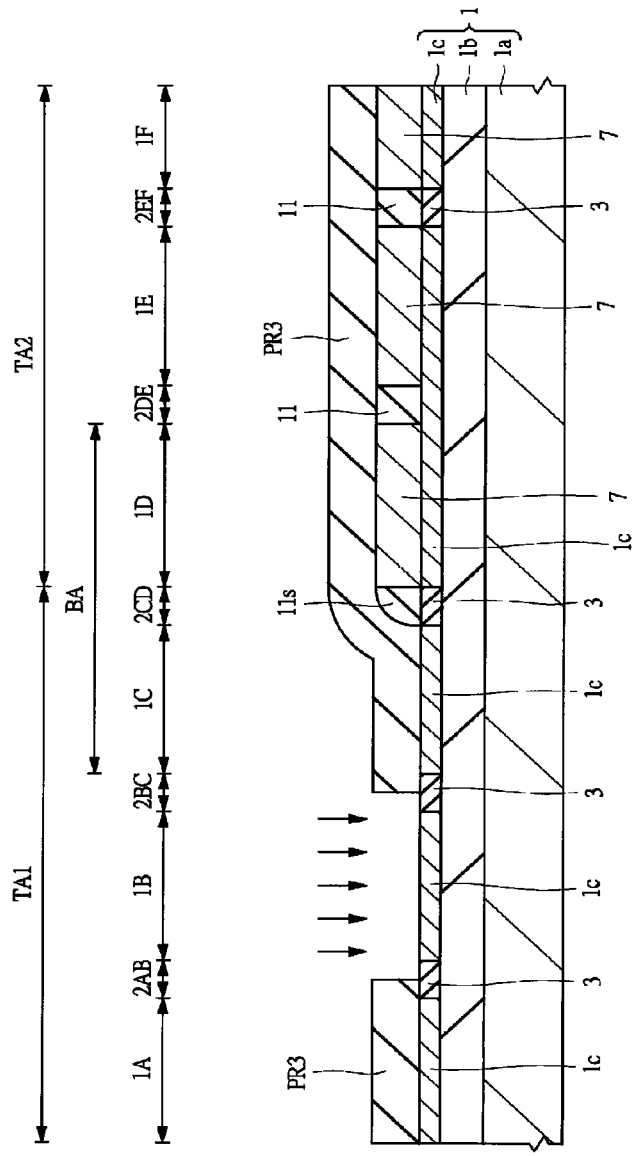
FIG. 9 is a cross-sectional view of the major portion showing steps of manufacturing a semiconductor device in accordance with Embodiment 1, and is a cross-sectional view of the major portion showing steps of manufacturing a semiconductor device following FIG. 8.

Then, after removing the photoresist film PR2, as shown in FIG. 9, a photoresist film PR3 having an opening over the element region 1B is formed over the SOI substrate 1. Subsequently, by an ion implantation method using the photoresist film PR3 as a mask, n-type impurities, such as phosphorus (P), are implanted into the element region 1B. This determines the channel concentration of the p-channel type MISFET TB formed in the element region 1B.

Figure 10:
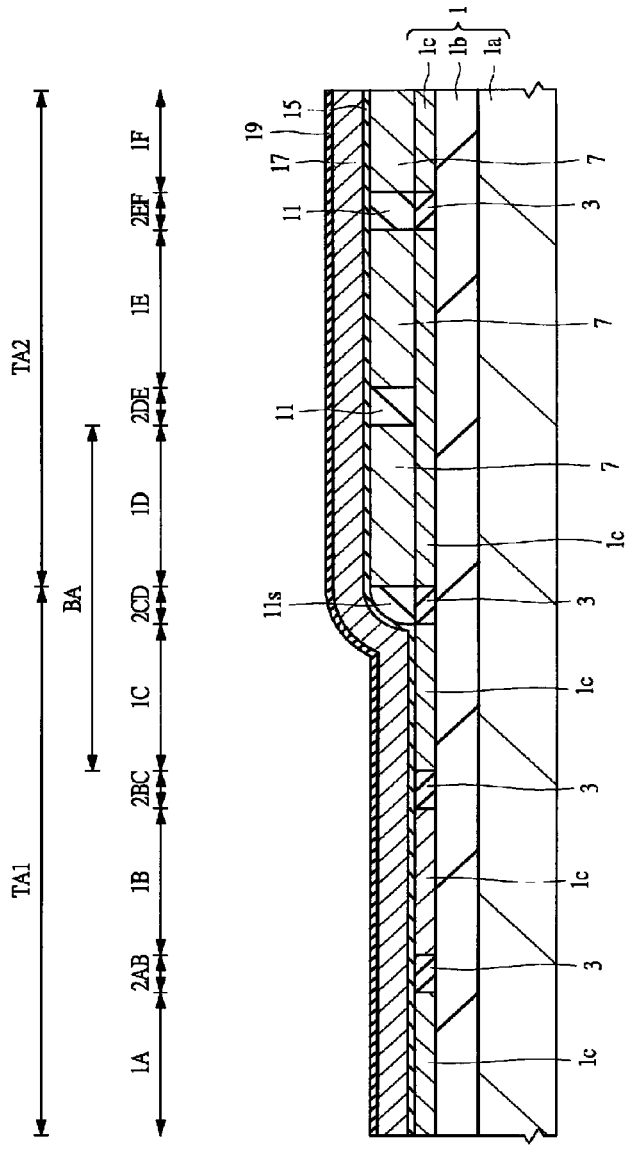
FIG. 10 is a cross-sectional view of the major portion showing steps of manufacturing a semiconductor device in accordance with Embodiment 1, and is across-sectional view of the major portion showing steps of manufacturing a semiconductor device following FIG. 9.

Then, after removing the photoresist film PR3, as shown in FIG. 10, a gate insulating film 15 is formed over the SOI substrate 1, and further, a polycrystalline silicon film 17 is formed above the gate insulating film 15. Although a method of forming a gate insulating film 15 is not limited, it is formed by thermally oxidizing surfaces of the silicon, layer 1c and the silicon film 7. In this case, the gate insulating film 15 is constituted by a silicon oxide film. As the gate insulating film 15, other than the silicon oxide film, a silicon oxynitride film may also be used. In addition, a high dielectric constant film (high-k film) may also be used as the gate insulating film 15. The high dielectric constant film means an insulating film having a dielectric constant higher than that of a silicon oxide film. It is possible to use a hafnium-based insulating film, such as a hafnium oxide film ($HfO_2$ film), a hafnium aluminate film, an HfON film (hafnium oxynitride film), an HfSiO film (hafnium silicate film), an HfSiON film (hafnium silicon oxynitride film), and an HfAlO film, as the gate insulating film 15. It is also possible to use a hafnium-based insulating film into which an oxide, such as tantalum oxide, niobium oxide, titanium oxide, zirconium oxide, lanthanum oxide, and yttrium oxide, is introduced, as the gate insulating film 15. Other than a thermal oxidization method, the gate insulating film 15 may also be formed using another film formation method, such as a CVD method.

This gate insulating film 15 becomes gate insulating films 15A, 15B, 15C, 15D, 15E, and 15F configuring the MISFETs TA, TB, TC, TD, TE, and TF in each of the element regions 1A, 1B, 1C, 1D, 1E, and 1F. The thicknesses and the types of the gate insulating film 15 may be modified in accordance with the properties of the MISFETs. A gate insulating film 15 may also be formed for each of these element regions to modify the thicknesses and the types of the gate insulating films 15A, 15B, 15C, 15D, 15E, and 15F.

The polycrystalline silicon film 17 over the gate insulating film 15 can be formed using a CVD method. In accordance with the properties of each of the MISFETs TA, TB, TC, TD, TE, and TF, impurities may also be implanted into the gate electrodes GA, GB, GC, GD, GE, and GF. A photoresist film (not shown) having an opening over a desired element region (any of 1A, 1B, 1C, 1D, 1E, or 1F) of the polycrystalline silicon film 17 is formed, and impurities are implanted into the polycrystalline silicon film 17 using the photoresist film as a mask. This enables to implant impurities into a desired region of the polycrystalline silicon film 17. By implanting n-type impurities (p-type impurities in a p-channel type MISFET) into a gate electrode of an n-channel type MISFET, the threshold voltage can be reduced. Impurities are not implanted into the gate electrodes GA and GB of the MISFETs TA and TB formed in the element regions 1A and 1B. The threshold voltage of these MISFETs TA and TB can be adjusted by the impurities to be implanted into the semiconductor layer immediately below the gate electrodes.

Then, over the polycrystalline silicon film 17, a silicon oxide film is deposited as a cap insulating film 19 by a CVD method. Subsequently, a photoresist film (not shown) is applied over the cap insulating film 19 and it is subjected to exposure and development processes, and then the photoresist film remains in planned regions for formation of the gate electrodes G (GA, GB, GC, GD, GE, and GF). In the exposure step, although an exposure light is irradiated to the photoresist film via a lens, it focuses on the basis of an upper layer region (here, the element regions 1D, 1E, and 1F) in which the element region 1F forming a finer pattern is located. In the upper layer region (element regions 1D, 1E, and 1F) and the lower layer region (element regions 1A, 1B, and 1C), a difference in height occurs, so that in a case of exposing in an identical exposure step, the focus position turns out to be shifted due to the difference in height. At this time, by adjusting the exposure light to focus in the region to form a finer pattern, the resolution improves and microfabrication can be carried out well. A degree of focusing of the exposure light is referred to as "an irradiation focusing degree". The irradiation focusing degree of the exposure light in the exposure step is focused in the upper layer region (element regions 1D, 1E, and 1F) rather than the lower layer region (element regions 1A, 1B, and 1C), and then the exposure accuracy (resolution) can be improved on the surface (region subjected to exposure) of the SOI substrate 1.

An antireflection film (not shown) may also be formed over the cap insulating film 19, and further, a photoresist film may also be formed over the antireflection film.

Figure 11:
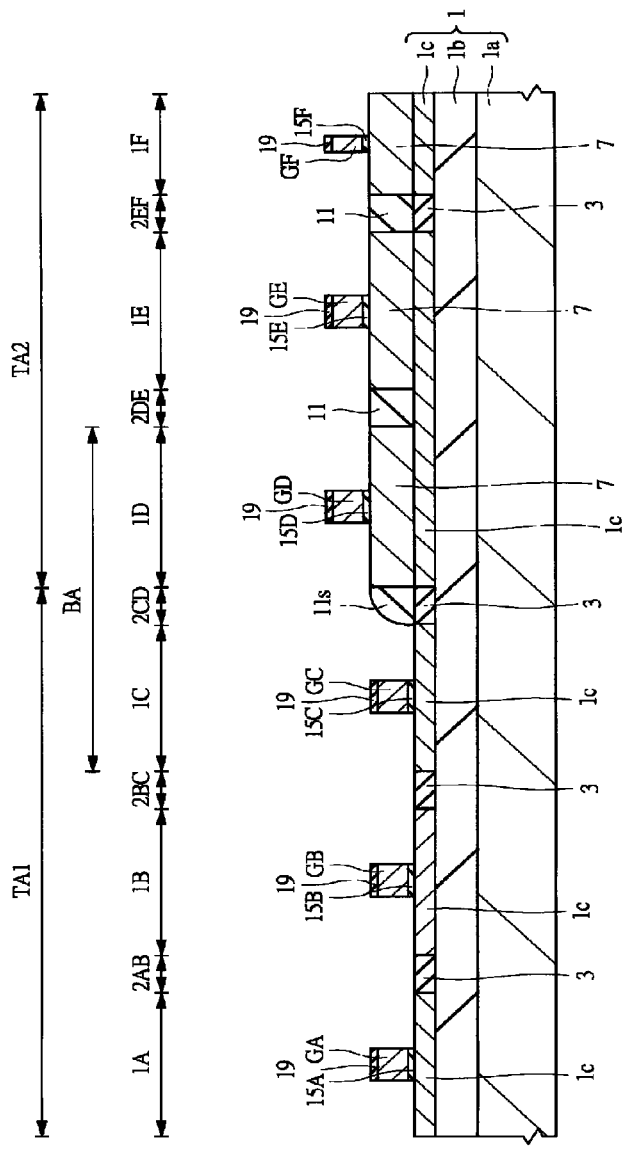
FIG. 11 is a cross-sectional view of the major portion showing steps of manufacturing a semiconductor device in accordance with Embodiment 1, and is a cross-sectional view of the major portion illustrating steps of showing a semiconductor device following FIG. 10.

Subsequently, as shown in FIG. 11, the cap insulating film 19 and the polycrystalline silicon film 17 are etched using the photoresist film as a mask, and then, the gate electrodes GA, GB, GC, GD, GE, and GF are formed on each of the element regions 1A, 1B, 1C, 1D, 1E, and 1F. After that, the photoresist film is removed.

The gate of the gate electrode GF formed in the element region 1F is relatively short. Specifically, the gate of the gate electrode GF is shorter than that of the gate electrode GA. Similarly, the gate of the gate electrode GF is shorter than that of any of the gate electrodes GB, GC, GD, and GE. While the gate lengths of the gate electrodes GA, GB, GC, GD, and GE are almost same, the gate lengths of these gate electrodes G may also be different in accordance with the properties of each of the MISFETs. The tendency that the gate of the gate electrode GF is shorter than that of any of the gate electrodes GA, GB, GC, GD, and GE remains unchanged.

Figure 12:
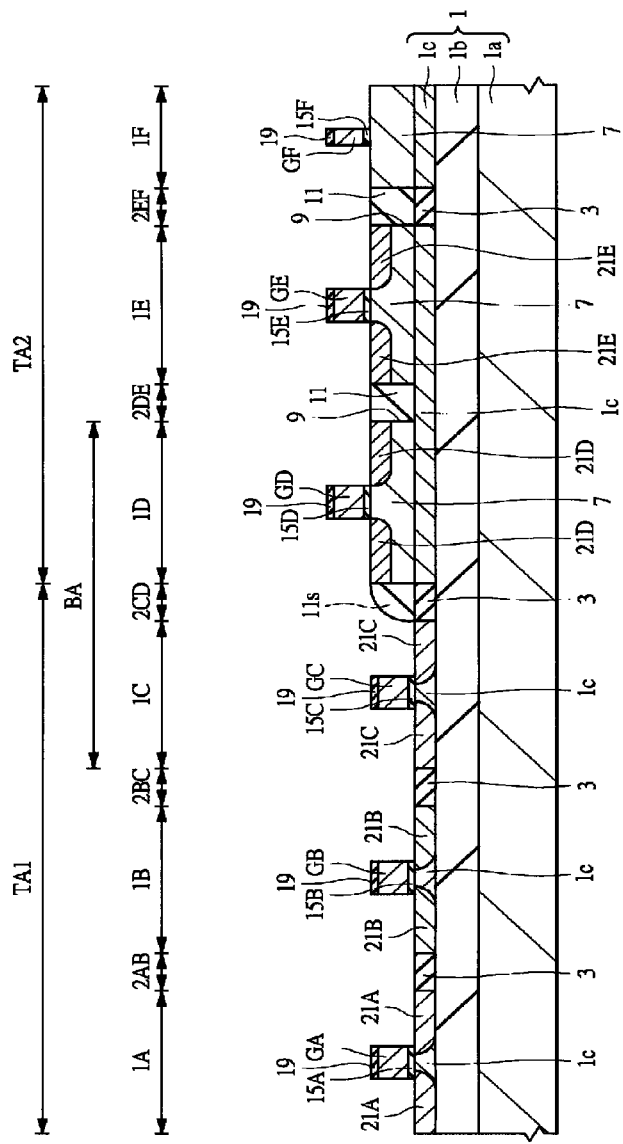
FIG. 12 is a cross-sectional view of the major portion showing steps of manufacturing a semiconductor device in accordance with Embodiment 1, and is a cross-sectional view of the major portion showing steps of manufacturing a semiconductor device following FIG. 11.

Subsequently, as shown in FIG. 12, a photoresist film (not shown) having an opening over the element region 1B is formed. Then, by ion implanting p-type impurities into both sides of the gate electrode GB using the photoresist film and the exposed cap insulating film 19 as masks, the p$^-$-type semiconductor region (low concentration p-type impurity region) 21B is formed. After that, the photoresist film is removed.

Subsequently, a photoresist film (not shown) having openings over the element regions 1A and 1C is formed. Then, by ion implanting n-type impurities into both sides of the gate electrodes GA and GC, using the photoresist film and the exposed cap insulating film 19 as masks, the n$^-$-type semiconductor regions (low concentration n-type impurity regions) 21A and 21C are formed. After that, the photoresist film is removed.

Figure 13:
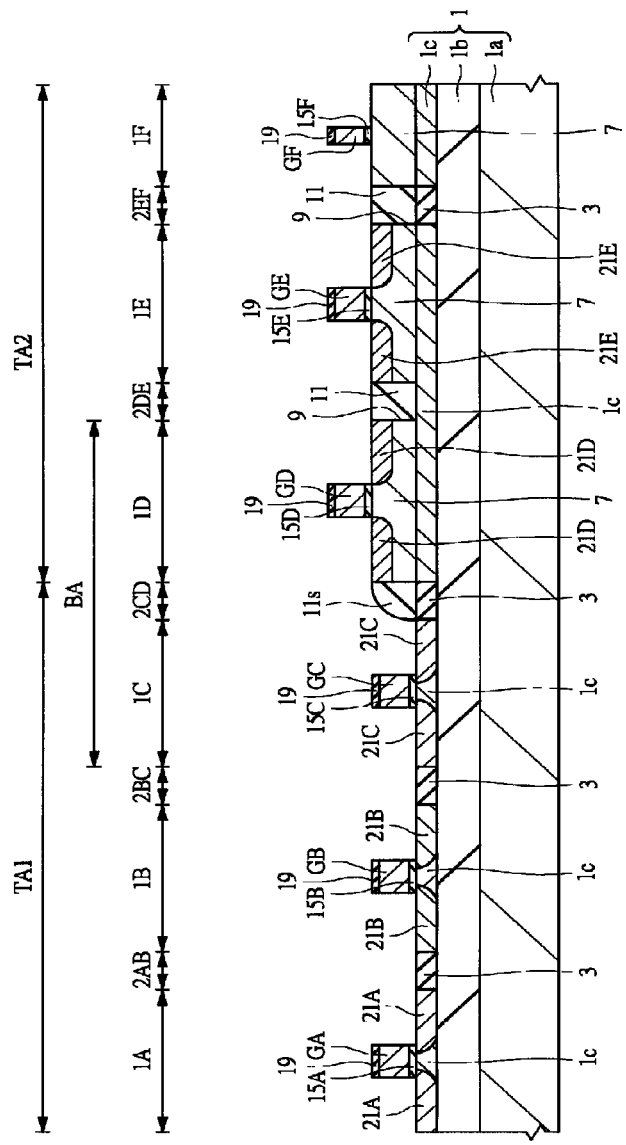
FIG. 13 is a cross-sectional view of the major portion showing steps of manufacturing a semiconductor device in accordance with Embodiment 1, and is a cross-sectional view of the major portion showing steps of manufacturing a semiconductor device following FIG. 12.

Subsequently, as shown in FIG. 13, a photoresist film (not shown) having openings over the element regions 1D and 1E is formed. Then, by ion implanting n type impurities into both sides of the gate electrodes GD and GE, using the photoresist film and the exposed cap insulating film 19 as masks, the n$^-$ type semiconductor regions (low concentration n type impurity regions) 21D and 21E are formed. After that, the photoresist film is removed.

Figure 14:
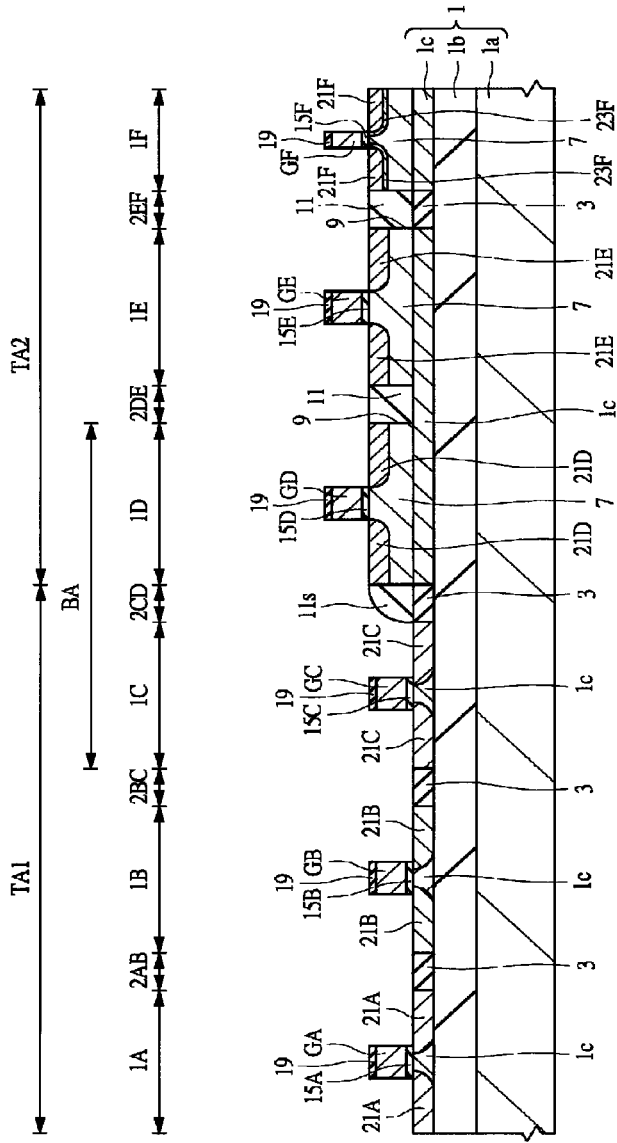
FIG. 14 is a cross-sectional view of the major portion showing steps of manufacturing a semiconductor device in accordance with Embodiment 1, and is a cross-sectional view of the major portion showing steps of manufacturing a semiconductor device following FIG. 13.

Subsequently, as shown in FIG. 14, a photoresist film (not shown) having an opening over the element region 1F is formed. Then, by ion implanting n-type impurities into both sides of the gate electrode GF using the photoresist film and the exposed cap insulating film 19 as masks, the n$^-$-type semiconductor region (low concentration n-type impurity region) 21F is formed. In addition, by ion implanting p-type impurities from a direction oblique to the principal surface of the SOI substrate 1, the p-type halo region (p-type impurity region) 23F is formed below the n$^-$-type semiconductor region 21F. Although the p-type halo region 23F does not necessarily have to be formed as described above, in a case of forming it, the diffusion of impurities from the source and drain regions to the channel formation region of the MISFET is controlled and the short channel effect is controlled. A decline in the threshold voltage can be controlled. After that, the photoresist film is removed.

By the above steps, in each of the element regions 1A, 1B, 1C, 1D, 1E, and 1F, the impurity regions 21A, 21B, 21C, 21D, 21E, and 21F at a low concentration and the halo region 23F are formed. The order of forming these regions is not limited to the step order described above, and can be changed appropriately.

Figure 15:
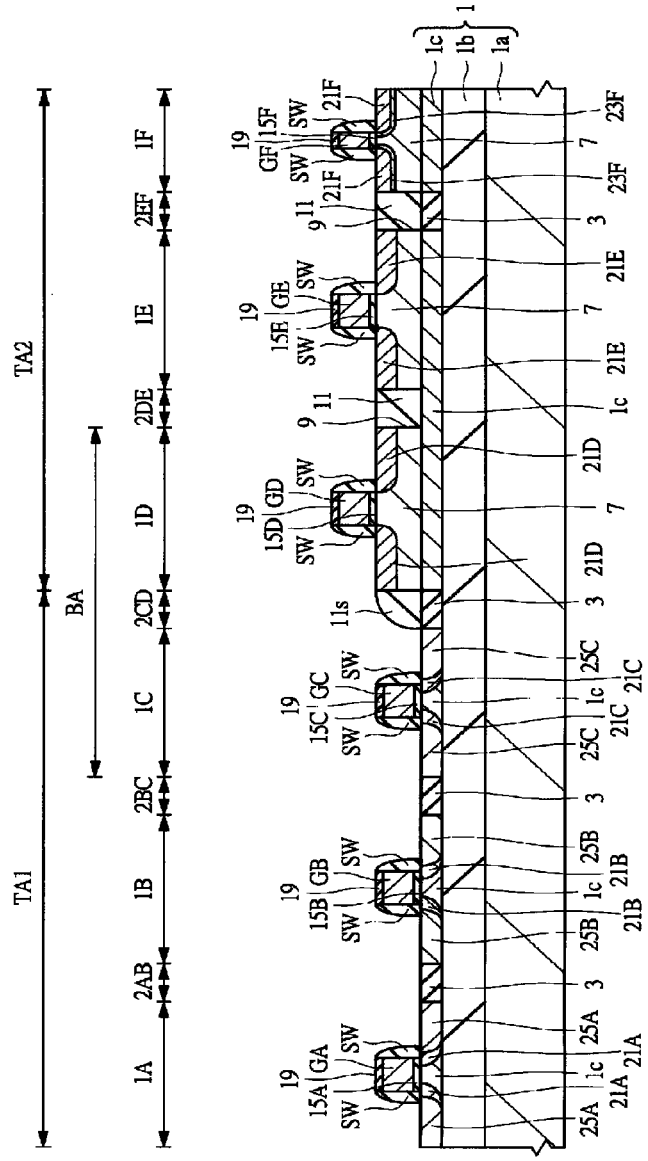
FIG. 15 is a cross-sectional view of the major portion showing steps of manufacturing a semiconductor device in accordance with Embodiment 1, and is a cross-sectional view of the major portion showing steps of manufacturing a semiconductor device following FIG. 14.

Subsequently, as shown in FIG. 15, side wall films SW are formed on the side walls of the gate electrodes GA, GB, GC, GD, GE, and GF as insulating films over the SOI substrate 1 by forming a silicon oxide film by a CVD method and then anisotropically etching the silicon oxide film. Although the side wall films SW are formed from a single layer film of a silicon oxide film, they are not limited to this and the side wall films SW including a laminated film of a silicon nitride film and a silicon oxide film may also be formed. In addition, the thicknesses of the side wall films SW may also be modified for each of the element regions 1A, 1B, 1C, 1D, 1E, and 1F. The thickness of the side wall films SW means a film thickness in a gate length direction. As described later, because the thicknesses of the side wall films SW define the distances between the ends of the gate electrodes GA, GB, GC, GD, GE, and GF and the high concentration impurity regions, the thicknesses of the side wall films SW may also be modified in accordance with the properties of the MISFETs. In the region to form the thin side wall films SW, after forming a thin silicon oxide film, anisotropic etching may be carried out. In the region to form the thick side wall films SW, after forming a thick silicon oxide film, anisotropic etching may be carried out. In addition, after forming first side wall films of a silicon nitride film or the like, second side wall films of a silicon oxide film or the like are further formed on the side walls to make side wall films including a laminated film of a silicon nitride film and a silicon oxide film, and thus the side wall films SW may also be thicken.

Subsequently, a photoresist film (not shown) having an opening over the element region 1B is formed, and by ion implanting p-type impurities into both sides of the gate electrode GB using the photoresist film, the exposed cap insulating film 19, and the side wall films SW as masks, the p$^+$-type semiconductor region (high concentration p-type impurity region) 25B is formed. After that, the photoresist film is removed.

Subsequently, a photoresist film (not shown) having openings over the element regions 1A and 1C is formed, and by ion implanting n-type impurities into both sides of the gate electrodes GA and GC, using the photoresist film, the exposed cap insulating film 19, and the side wall films SW as masks, the n$^+$-type semiconductor regions (high concentration n-type impurity regions) 25A and 25C are formed. After that, the photoresist film is removed.

Subsequently, as shown in FIG. 16, a photoresist film (not shown) having openings over the element regions 1D and 1E is formed, and by ion implanting n-type impurities into both sides of the gate electrodes GD and GE, using the photoresist film, the exposed cap insulating film 19, and the side wall films SW as masks, the n$^+$-type semiconductor regions (high concentration n-type impurity regions) 25D and 25E are formed. After that, the photoresist film is removed.

Subsequently, a photoresist film (not shown) having an opening over the element region 1F is formed, and by ion implanting n-type impurities into both sides of the gate electrode GF using the photoresist film, the exposed cap insulating film 19, and the side wall films SW as masks, the n$^+$-type semiconductor region (high concentration n-type impurity region) 25F is formed. After that, the photoresist film is removed.

By the above steps, in each of the element regions 1A, 1B, 1C, 1D, 1E, and 1F, the impurity regions 25A, 25B, 25C, 25D, 25E, and 25F at a high concentration are formed. The order of forming these regions is not limited to the step order described above, and can be changed appropriately.

In addition, by the steps described so far, the MISFETs TA, TB, TC, TD, TE, and TF having the source and drain regions 21A through 21F and 25A through 25F of an LDD structure are formed.

After that as needed, over the source and drain regions 21A through 21F and 25A through 25F and the gate electrodes GA, GB, GC, GD, GE, and GF, silicide films (compound layer of metal and a semiconductor, not shown) are formed. As this silicide films, cobalt silicide films can be formed. The cobalt silicide films are formed by removing the cap insulating film 19, and then depositing a metal film, such as a cobalt film, over the SOI substrate 1 by a sputtering method or the like, followed by heat treatment to develop a silicidizing reaction in contact portions of the source and drain regions 21A through 21F and 25A through 25F and the cobalt film and of the gate electrodes GA through GF and the cobalt film.

The silicide films are formed to lower the resistance of the gate electrodes GA, GB, GC, GD, GE, and GF and the source and drain regions 21A through 21F and 25A through 25F.

Subsequently, unreacted cobalt film is removed by etching. Instead of cobalt silicide films, compound layers of silicon and metal other than cobalt, such as nickel silicide films, titanium silicide films, and nickel platinum silicide films, or metal films, such as a platinum film, may also be formed.

<Wiring Formation Step and Mounting Step>

Figure 17:
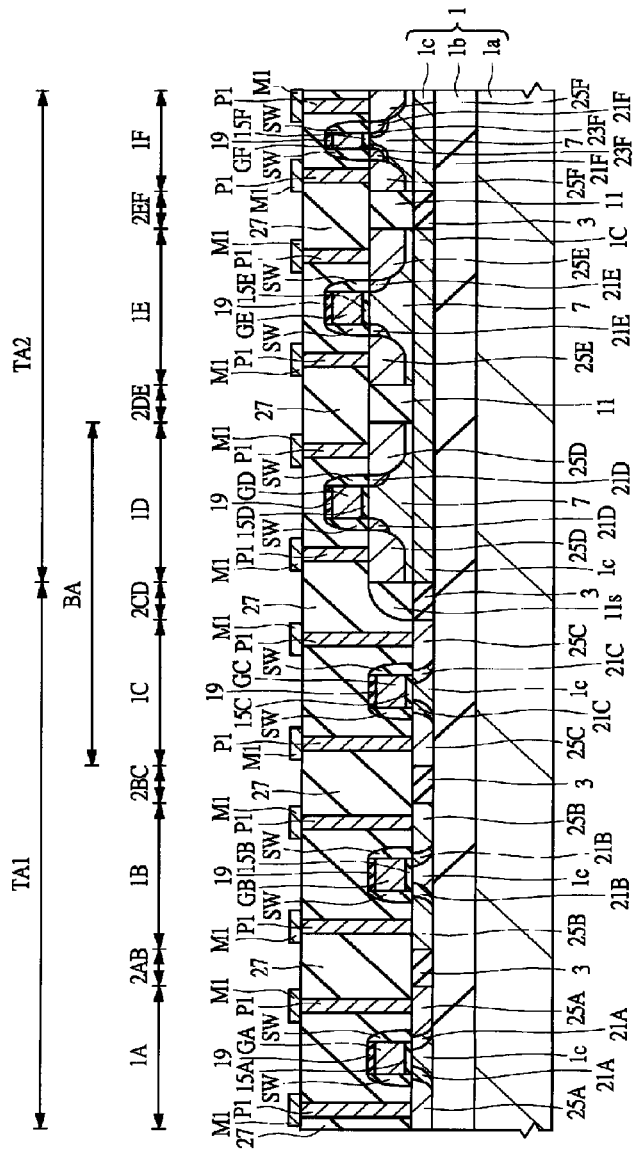
FIG. 17 is a cross-sectional view of the major portion showing steps of manufacturing a semiconductor device in accordance with Embodiment 1, and is a cross-sectional view of the major portion showing steps of manufacturing a semiconductor device following FIG. 16.

Subsequently, as shown in FIG. 17, over the main surface of the SOI substrate 1, a laminated film of a silicon nitride film and a silicon oxide film is deposited as an interlayer insulating film 27 by a CVD method or the like. Subsequently, the surface of the interlayer insulating film 27 is planarized using a CMP method or the like.

Subsequently, using a photolithography technique and an etching technique, the interlayer insulating film 27 over the source and drain regions (25A through 25F) is removed selectively, and then, contact holes (connection bores) are formed. At this time, the contact holes may also be formed over the gate electrodes GA, GB, GC, GD, GE, and GF.

Subsequently, over the interlayer insulating film 27 including inside the contact holes, a laminated film of titanium and a titanium nitride film is deposited as a barrier film using a sputtering method or the like. Subsequently, tungsten film is deposited over the barrier film as a conductive film using a CVD method or the like, and the unnecessary barrier film and conductive film formed on the interlayer insulating film 27 are removed using a CMP method or the like. Then, plugs P1 are formed.

Subsequently, over the interlayer insulating film 27 and the plugs P1, a laminated film including a titanium/titanium nitride film, an aluminum film, and a titanium/titanium nitride film is deposited as a conductive film using a sputtering method or the like. Subsequently, by patterning the laminated film described above using a photolithography technique and an etching technique, first layer wirings M1 are formed.

Subsequently, although omitted from the drawing, wirings of second layer wirings and later are formed by repeating formation of an interlayer insulating film, plugs, and wirings over the first layer wirings M1. Further, over the upper most layer wirings, a silicon nitride film is formed as a protective insulating film (insulating film, passivation film). Subsequently, using a photolithography technique and an etching technique, by selectively removing the protective insulating film on the upper most layer wirings, pad regions are opened.

Subsequently, the SOI substrate 1 in a wafer shape is cut (diced) to separate (segment into pieces) it into a plurality of approximately rectangular semiconductor chips. Before dicing, the SOI substrate 1 may also be thinned by backgrinding the SOI substrate 1.

After that, the semiconductor chips are mounted (adhered, die bonded) over a wiring board or the like, and the pad regions described above and terminals of the wiring board are connected (wire bonded) with wires (conductive member) including a gold wire or the like.

After that, as needed, a sealing resin (molding resin) is formed for encapsulation to cover the semiconductor chips and the wires.

By the above steps, it is possible to manufacture a semiconductor device in accordance with the present embodiment.

In accordance with the manufacturing method of a semiconductor device of the present embodiment, it is possible to form the thin film region (SOI region) TA1 and the thick film region (bulk region) TA2 over an identical substrate. In particular, using epitaxial growth enables to form the thick film region TA2 in simple steps. This enables to form the SOI-MISes TA, TB, and TC and the bulk MISes TD, TE, and TF over an identical substrate. It is possible to form a multifunctional semiconductor device. As explained in Embodiment 4 in detail described later, it becomes possible to fabricate circuits having a plurality of functions into one chip.

In addition, in accordance with the properties of the bulk MISes TD, TE, and TF, the form (partial isolation or perfect isolation) of element isolation between the elements can be made into a preferred one in simple steps. By forming, in advance, the element isolation insulating film 3 in the silicon layer (thin film semiconductor region) 1c to be a starting point of epitaxial growth in a region intended to form perfect isolation in the thick film region TA2, epitaxial growth does not develop over this element isolation insulating film 3. So, the region becomes a recess, and after that, it becomes possible to easily form perfect isolation only by embedding the element isolation insulating film 11.

In a region just having to form partial isolation, by forming a hard mask 5 also over the region (region just having to form partial isolation) using the hard mask (mask film) 5 to inhibit epitaxial growth on the thin film region TA1, it is possible to easily form partial isolation.

Figure 20:
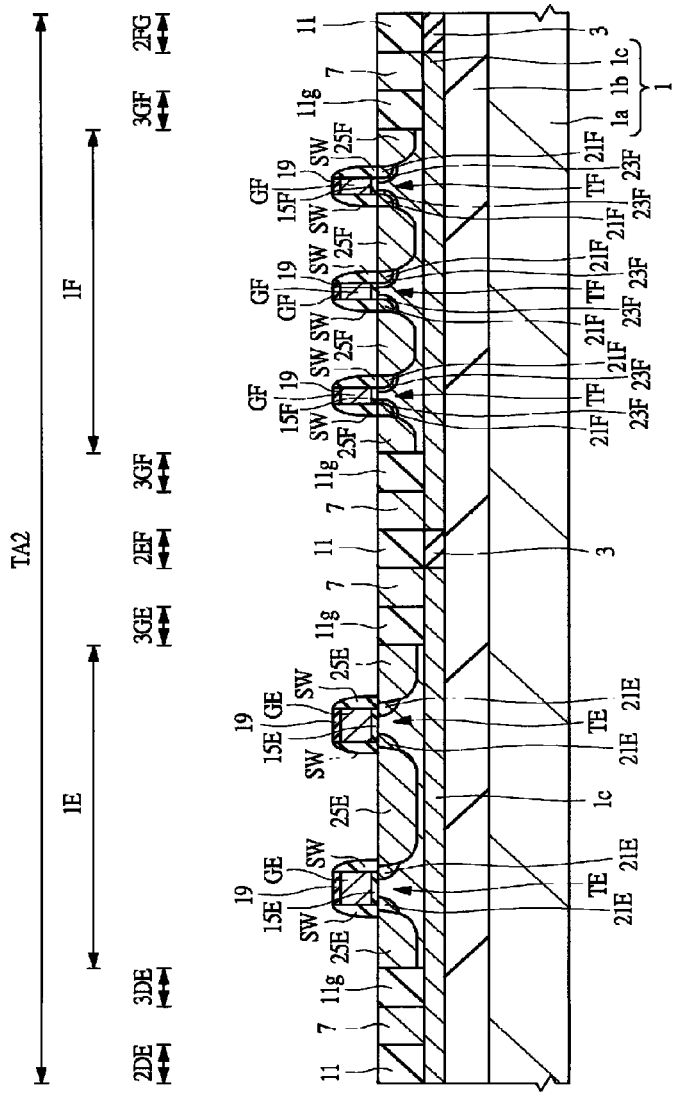
FIG. 20 is a cross-sectional view of the major portion showing steps of manufacturing a semiconductor device in accordance with Embodiment 2, and is a cross-sectional view of the major portion showing steps of manufacturing a semiconductor device following FIG. 19.

Although one n-channel type of MISFETs is exemplified as MISFETs formed in the element regions 1C, 1D, 1E, 1F, and the like in the present embodiment, a plurality of n-channel types of MISFETs may also be formed in these regions (refer to FIG. 20). In addition, p-channel type MISFETs may also be formed in these regions. The steps of forming a p-channel type MISFET are similar to the steps of forming an n-channel type MISFET other than defining the conductivity type of impurities as the opposite conductivity type. In addition, complementary MISFETs (n-channel type MISFET and p-channel type MISFET) may also be formed in the element regions 1C, 1D, 1E, and 1F. In addition, as isolation between these MISFETs, partial isolation or perfect isolation may also be used.

Embodiment 2

Although the laminated film of the element isolation insulating films 3 and 11 is provided between the element region 1E in which the MISFET for an analog circuit is formed and the element region 1F in which the MISFET for a digital circuit is formed for perfect isolation between these regions 1E and 1F in Embodiment 1, guard rings 11g may also be provided further to surround an outer periphery of the element region 1E and the element region 1F.

Figure 18:
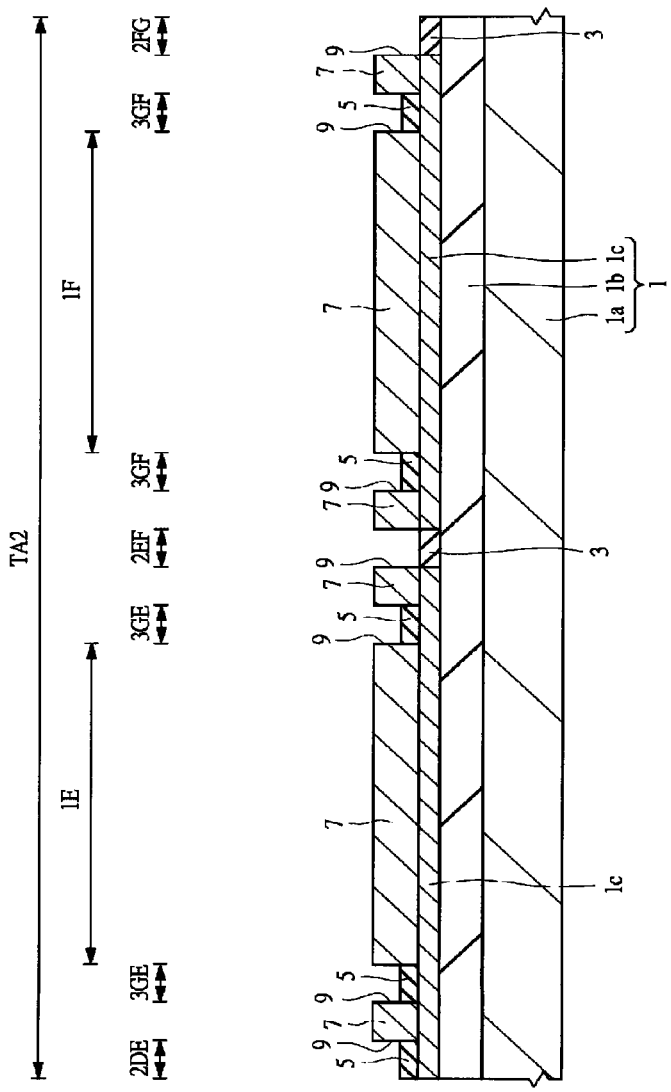
FIG. 18 is a cross-sectional view of the major portion showing steps of manufacturing a semiconductor device in accordance with Embodiment 2.
Figure 19:
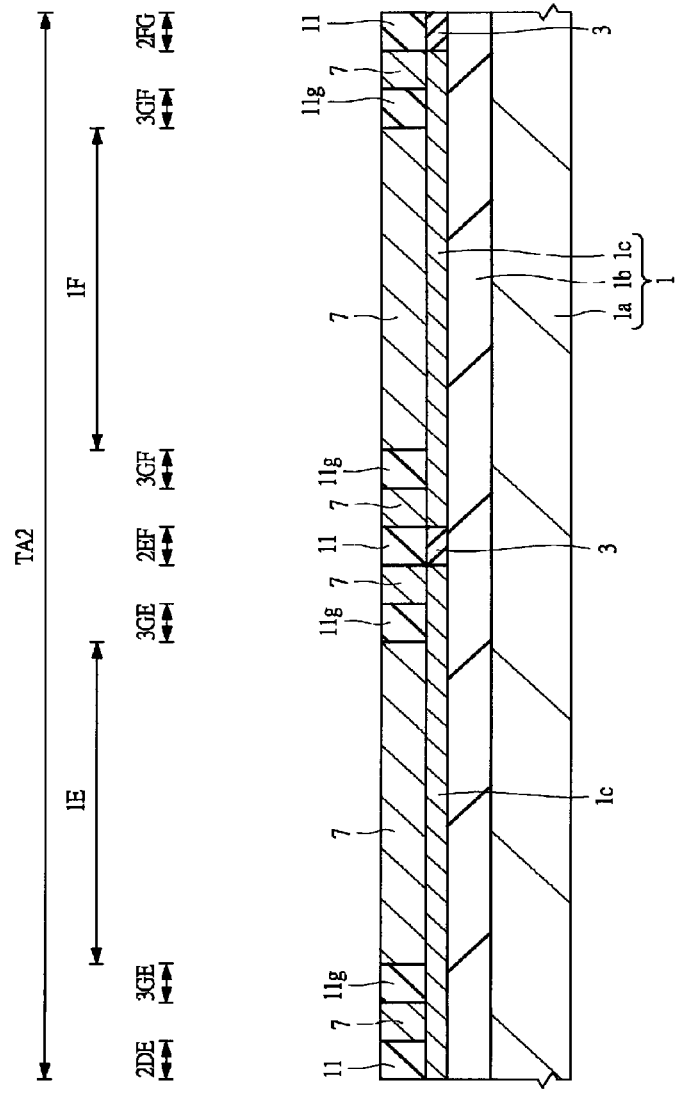
FIG. 19 is a cross-sectional view of the major portion showing steps of manufacturing a semiconductor device in accordance with Embodiment 2, and is a cross-sectional view of the major portion showing steps of manufacturing a semiconductor device following FIG. 18.

With reference to the drawings, the following explains a structure and a manufacturing method of a semiconductor device in accordance with the present embodiment. FIGS. 18 through 20 are cross-sectional views of the major portion illustrating steps of manufacturing a semiconductor device in accordance with the present embodiment. Because the structure and the manufacturing steps of the regions other than the element regions 1E and 1F are similar to those in Embodiment 1, the detailed explanation is omitted.

[Explanation on Structure]

First, with reference to FIG. 20, which is one drawing of the cross-sectional views of the major portion showing the steps of manufacturing a semiconductor device of the present embodiment, the following explains a characteristic structure of the semiconductor device in accordance with the present embodiment.

The semiconductor device in accordance with the present embodiment, similar to that of Embodiment 1, has a plurality of MISFETs TA, TB, TC, TD, TE, and TF formed on an SOI substrate 1 having a thin film region. TA1 and a thick film region TA2 (refer to FIG. 16).

Among the MISFETs, the MISFET TE disposed in an element region 1E is surrounded by a guard ring 11g (refer to FIG. 20). This guard ring 11g includes an insulating film (element isolation insulating film) disposed between silicon films (semiconductor regions) 7.

The element region 1E is almost a rectangular region in a planar view from the upper surface, and a plurality of MISFETs TE is formed inside the region. On an outer periphery of this region described above, the guard ring 11g having a predetermined width is disposed to surround the region. Inside this guard ring 11g, the MISFETs TE are disposed. At a predetermined interval from outside the guard ring 11g, isolation regions 2DE and 2EF are located. The region surrounded by the isolation regions 2DE and 2EF including the guard ring 11g may also be defined as the element region 1E.

An MISFET TF disposed in the element region 1F is surrounded by the guard ring 11g (refer to FIG. 20). This guard ring 11g includes an insulating film (element isolation insulating film) disposed between the silicon films (semiconductor regions) 7.

As explained in Embodiment 1 in detail, the MISFET TE disposed in the element region 1E is an n-channel type MISFETs in which the source and drain regions 21E and 25E do not reach the insulating layer (embedded insulating layer, BOX) 1b, and can be used as an MISFET for an analog circuit.

The element region 1F is almost a rectangular region in a planar view from the upper surface, and a plurality of MISFETs TF is formed inside the region. On an outer periphery of this region described above, the guard ring 11g having a predetermined width is disposed to surround the region. Inside this guard ring 11g, the MISFETs TF are disposed. At a predetermined interval from outside the guard ring 11g, isolation regions 2EF and 2FG are located. The region surrounded by the isolation regions 2EF and 2FG including the guard ring 11g may also be defined as the element region 1F.

As explained in Embodiment 1 in detail, the MISFET TF disposed in the element region 1F is an n-channel type MISFET in which the source and drain regions 21F and 25F do not reach the insulating layer (embedded insulating layer, BOX) 1b, and can be used as an MISFET for a digital circuit.

As explained in Embodiment 1 in detail, an MISFET for a digital circuit has various characteristics.

Because of the short gate length (channel length) and reduction of a short channel effect, the MISFET may have a halo region 23F.

The MISFET TF has a gate length shorter than that of the MISFET TE. The MISFET TF has the halo region 23F below the low concentration impurity region (the n⁻-type semiconductor region 21F) in the source and drain regions 21F and 25F having an LDD structure.

The MISFET TF for a digital circuit has, compared with that of the MISFETs TD and TE for an analog circuit, a small concentration difference between the n⁻-type semiconductor regions (low concentration n-type impurity regions) 21F and the n⁺-type semiconductor regions (high concentration n-type impurity regions) 25F. The n⁻-type semiconductor regions 21F have a concentration one tenth or more of that of the n⁺-type semiconductor regions 25F, whereas the MISFET (TD) for an analog circuit often has the n⁺-type semiconductor region 25D having a concentration ten times or more of that of the n⁻-type semiconductor region 21D.

As explained above in detail, also by the semiconductor device of the present embodiment, it is possible to exhibit the effects explained in Embodiment 1. Further, because the MISFETs TE disposed in the element region 1E and the MISFETs TF disposed in the element region 1F are surrounded by the respective guard rings 11g, it is possible to reduce the interference of these MISFETs TE and TF with each other even more and it is possible to operate each of the MISFETs well.

[Explanation on Manufacturing Method]

Subsequently, with reference to FIGS. 18 through 20, the manufacturing method of a semiconductor device in accordance with the present embodiment is explained and also the structure of the semiconductor device is clarified more.

First, similar to Embodiment 1, an SOI substrate 1 in FIG. 18 is provided. The SOI substrate 1 includes a supporting substrate 1a including silicon single crystal, an insulating layer (embedded insulating layer, BOX) 1b formed over this supporting substrate 1a, and a silicon layer (thin film semiconductor region) 1c formed over the insulating layer 1b.

Subsequently, similar to Embodiment 1, element isolation insulating films 3 are formed in the silicon layer (semiconductor region) 1c in isolation regions 2AB, 2BC, 2CD, and 2EF of the SOI substrate 1. In FIGS. 18 through 20, because the left from the isolation region 2DE is not shown, only the isolation region 2EF is shown as the isolation regions described above. In addition, the isolation region 2FG on the right of the element region 1F is shown. This isolation region 2FG is a region subjected to perfect isolation.

Subsequently, as a hard mask (mask film) 5 for selective epitaxial growth, a silicon oxide film is deposited over the SOI substrate 1 by a CVD method or the like and the silicon oxide film is selectively removed using a photolithography technique and an etching technique. Then, the hard mask 5 remains in the thin film region TA1 (not shown in FIG. 18). In addition to the isolation region 2DE subjected to partial isolation, guard ring formation regions 3GE and 3GF.

Subsequently, using the hard mask 5 and the element isolation insulating films 3 in the isolation regions 2DE, 2EF and 2FG as a mask, the silicon film (semiconductor region) 7 from the exposed silicon layer 1c is epitaxially grown. FIG. 18 shows the silicon film 7 epitaxially grown from the silicon layer 1c of the element regions 1E and 1F. At this time, also in a space between the guard ring formation regions 3GE and 3GF and the isolation regions 2DE, 2EF, and 2FG, the silicon films (semiconductor regions) 7 are epitaxially grown.

By covering, with the hard mask 5, the guard ring formation regions 3GE and 3GF in addition to the region 2DE that may be of partial isolation explained in Embodiment 1, the silicon film 7 can be epitaxially grown selectively in the necessary regions (in FIG. 18, the element regions 1E and 1F). This forms a laminated film of the silicon layer 1c and the silicon film 7 in the element regions 1E and 1F. In the thick film region TA2, because the silicon film 7 is not epitaxially grown over the guard ring formation regions 3GE and 3GF covered with the hard mask 5, the isolation region 2DE to be subjected to partial isolation, and the isolation regions 2EF and 2FG in which the element isolation insulating films 3 are exposed, isolation grooves (recesses) 9 are formed in these regions.

Subsequently, similar to Embodiment 1, after removing the hard mask 5 by etching, as shown in FIG. 19, element isolation insulating films 11 and guard rings 11g (element isolation insulating films) are formed by embedding an insulating film into the isolation grooves 9. A silicon oxide film is deposited over the SOI substrate 1 with a film thickness to the extent of embedding the isolation grooves 9 using a CVD method or the like, and the silicon oxide film outside the isolation grooves 9 is removed by anisotropic etching. This enables to embed a silicon oxide film into the isolation grooves 9.

After that, as shown in FIG. 20, MISFETs (in the region shown in FIG. 20, TE and TF) are formed in the element regions (in the region shown in FIGS. 20, 1E and 1F). Although a method of forming the MISFETs is not limited, they can be formed in the steps explained in Embodiment 1. Details of the formation steps are omitted.

After the MISFETs (TE, TF, and the like) described above are formed, similar to Embodiment 1, silicide films, an interlayer insulating film 27, plugs P1, and first layer wirings M1 are formed (refer to FIG. 17).

Subsequently, similar to Embodiment 1, as needed, after wirings are formed in even more upper layers, a protective insulating film and pad regions are formed over an upper most layer wirings.

After that, similar to Embodiment 1, after cutting (dicing) the SOI substrate 1 to separate (segment into pieces) it into a plurality of semiconductor chips, implementation is carried out. The semiconductor chips are mounted on a wiring board, and the pad regions described above and terminals of the wiring board are connected with wires including a gold wire or the like. After that, as needed, encapsulation is performed to cover the semiconductor chips and the wires with a sealing resin.

By the above steps, it is possible to manufacture a semiconductor device in accordance with the present embodiment.

Also by the manufacturing method of a semiconductor device in accordance with the present embodiment, it is possible to exhibit the effects explained in Embodiment 1. Further, in the guard ring formation regions in addition to the regions just having to form partial isolation, by forming masks also over the regions utilizing the hard mask (mask film) 5 to inhibit epitaxial growth over the thin film region TA1, it is possible to easily form the partial isolation 2DE and the guard rings 11g.

Although the n-channel type MISFETs are exemplified as MISFETs formed in the element regions 1E and 1F in the present embodiment, p-channel type MISFETs may also be formed in these regions. The steps of forming a p-channel type MISFET are similar to the steps of forming an n-channel type MISFET other than defining the conductivity type of impurities as the opposite conductivity type. In addition, complementary MISFETs (n-channel type MISFET and p-channel type MISFET) may also be formed in the element regions 1E and 1F. In addition, as isolation between these MISFETs, partial isolation or perfect isolation may also be used.

In addition, in the guard ring formation regions 3GE and 3GF, the element isolation, insulating films 3 may also be formed in advance to configure the guard rings with a laminated film of the element isolation insulating films 3 and 11.

Embodiment 3

In the present embodiment, First Example in which an MIS capacitor (capacitive element) is disposed in a thick film region TA2 and Second Example in which an LDMOS is disposed in a thick film region TA2 are explained. As described above, because the voltage resistance can be high in the thick film region TA2, an LDMOS can be formed as an element having high voltage resistance.

First Example

Figure 21:
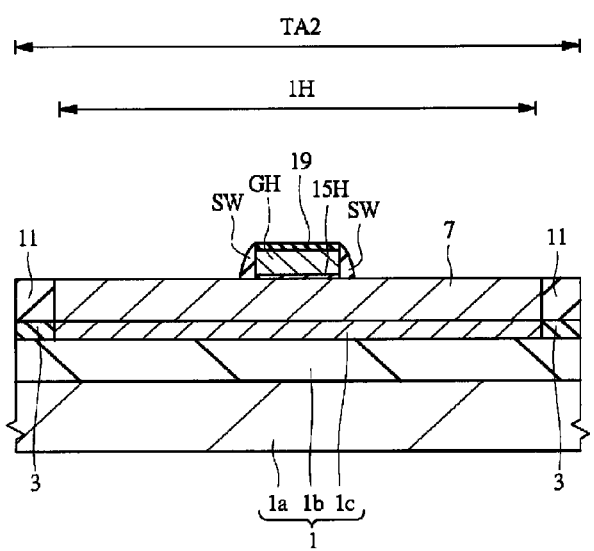
FIG. 21 is a cross-sectional view of the major portion showing a structure of a semiconductor device having an MIS capacitor disposed in a thick film region, which is a semiconductor device in accordance with Embodiment 3.

FIG. 21 is a cross-sectional view of the major portion showing a structure of a semiconductor device having an MIS capacitor disposed in a thick film region, which is a semiconductor device in accordance with the present embodiment.

The semiconductor device of the present embodiment has, similar to Embodiment 1, a plurality of MISFETs TA, TB, TC, TD, TE, and TF formed on an SOI substrate 1 having a thin film region TA1 and a thick film region TA2 (refer to FIG. 16).

As shown in FIG. 21, in the semiconductor device in accordance with the present embodiment, an MIS capacitor is formed in an element region 1H, which is apart of the thick film region TA2.

The MIS capacitor has a silicon film (semiconductor region) 7, a gate insulating film 15H disposed over the silicon film 7, and a gate electrode GH disposed over the gate insulating film 15H. This MIS capacitor includes the silicon film 7 and the gate electrode GH as capacitor electrodes and the gate insulating film 15H as a capacitor insulating film. Impurities may also be introduced in the silicon film 7 to regard the impurity region as a capacitor electrode.

Although steps of manufacturing components of the MIS capacitor described above are not limited, it is possible to form them in identical steps for the components of the MISFETs TA, TB, TC, TD, TE, and TF. Specifically, the gate insulating film (capacitor insulating film) 15H can be formed in identical steps for the gate insulating film 15A or the like. In addition, the gate electrode (capacitor electrode) GH can be formed in identical steps for the gate electrode GA or the like. In addition, to introduce impurities in the silicon film 7, the gate electrode (capacitor electrode) GH can be formed in steps identical to the well formation steps. Impurities may also be introduced in steps separate from the well formation steps.

Second Example

Figure 22:
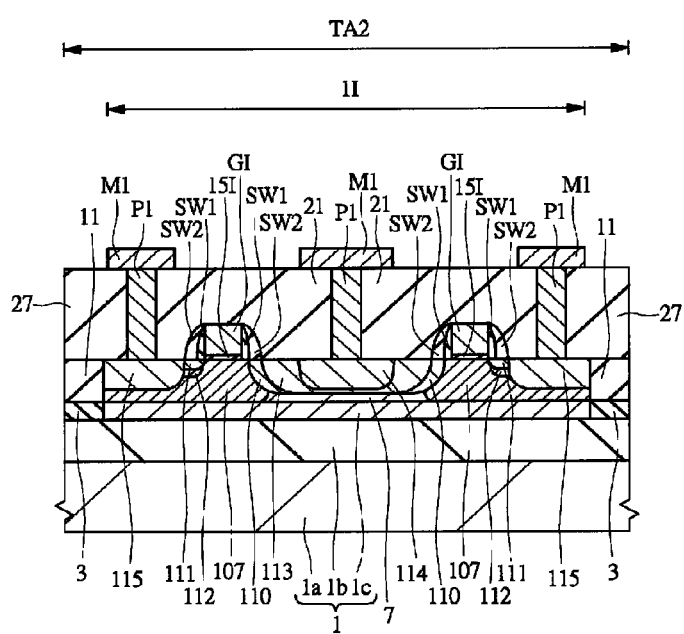
FIG. 22 is a cross-sectional view of the major portion showing a structure of a semiconductor device having an LDMOS disposed in a thick film region, which is a semiconductor device in accordance with Embodiment 3.

FIG. 22 is a cross-sectional view of the major portion showing a structure of a semiconductor device having an LDMOS disposed in a thick film region, which is a semiconductor device in accordance with the present embodiment.

The semiconductor device in accordance with the present embodiment has, similar to Embodiment 1, a plurality of MISFETs TA, TB, TC, TD, TE, and TF formed on an SOI substrate 1 having a thin film region TA1 and a thick film region TA2 (refer to FIG. 16).

As shown in FIG. 22, LDMOSes are formed in an element region 1I, which is a part of the thick film region TA2. While a structure of such an LDMOS is various, it can be the structure shown as follows, for example. Although it is shown as "MOS" here for convenience, it is defined to include, not only a MOS using an oxide film (silicon oxide film) as a gate insulating film, but also a MIS using an insulating film other than an oxide film (silicon oxide film) as a gate insulating film.

The LDMOS in accordance with the present embodiment has a drain region formed on a main surface of the silicon film (semiconductor region) 7 in the element region 1I of the SOI substrate 1 and including a first $n^-$-type drain region 110, a second $n^-$-type drain region 113, and an $n^+$-type drain region 114. It also has a source region including an $n^-$-type source region 111 and an $n^+$-type source region 115 and a gate electrode GI formed over a region (channel region) between the source region and the drain region described above via a gate insulating film 15I.

Although the LDMOS is an MISFET element, it is an element having the following features (first through third features).

As a first feature, such an LDMOS has an LDD region formed on a drain side of the gate electrode GI to enable a high voltage operation with a short channel length. The drain of the LDMOS includes an n$^+$-type region at a high impurity concentration (the n$^+$-type drain region 114) and an LDD region at an impurity concentration lower than that (the first n$^-$-type drain region 110 and the second n$^-$-type drain region 113), and the n$^+$-type region (the n$^+$-type drain region 114) is formed away from the gate electrode GI via the LDD region. This enables to realize high voltage resistance. It is preferred to optimize the amount of electric charge (impurity concentration) in the LDD region on the drain side and the distance between an end of the gate electrode GI and the n$^+$-type drain region (drain high concentration region) 114 so that the breakdown voltage of the LDMOS reaches a maximum value.

As a second feature, the LDMOS has a p-type well (p-type base region) 107 for a punchthrough stopper formed in the source region (the n$^-$-type source region 111 and the n$^+$-type source region 115) on the source side and in the channel formation region. On the drain side (in the drain region) of the LDMOS, this p-type well 107 is not formed or is formed only to make contact with a part of the end of the drain region on the side closer to the channel formation region. There is a region in which the p-type well 107 is not formed below the drain region (the drain region including the first n$^-$-type drain region 110, the second n$^-$-type drain region 113, and the n$^+$-type drain region 114). The p-type well 107 is not formed at least below the n$^+$-type drain region 114 constituting the drain.

As a third feature, the LDMOS has the source region (the n$^-$-type source region 111 and the n$^+$-type source region 115) and the drain region (the first n$^-$-type drain region 110, the second n$^-$-type drain region 113, and the n$^+$-type drain region 114) having an asymmetric structure relative to the gate electrode GI.

In particular, in the LDMOS, a distance (referred to as a "DS") between the n$^+$-type source region 115 constituting the source region and the end of the gate electrode GI on the source region side and a distance (referred to as a "DD") between the n$^+$-type drain region 114 constituting the drain and the end of the gate electrode GI on the drain region side are asymmetric. Their relationship is "DS<DD".

Although the steps of manufacturing components of an LDMOS are not limited, they can be formed in the following steps.

[Explanation on Manufacturing Method]

First, as shown in FIG. 22, similar to Embodiment 1, an SOI substrate 1 is provided and an element region (silicon film 7) 1I and isolation regions (element isolation insulating films 3 and 11), which are of perfect isolation surrounding to that, are formed in the thick film region TA2. The element region 1I and the isolation regions can be formed in a similar manner to the element region 1E and the isolation region 2EF of Embodiment 1.

Subsequently, a p-type well 107 is formed by implanting p-type impurity ions into the silicon film (semiconductor region) 7 in the thick film region TA2. Then, by heat treating the SOI substrate 1, a gate insulating film 15I, which includes a silicon oxide film, on a surface of the silicon film 7.

Then, a gate electrode GI is formed by depositing a polycrystalline silicon film on the gate insulating film 15I and patterning the polycrystalline silicon film.

Then, using a photoresist film (not shown) in a predetermined shape as an ion implantation inhibition mask, an n$^-$-type source region 111 is formed by ion implanting n-type impurities, such as arsenic (As), in a part of surface of the p-type well 107. Then, side wall films (side wall insulating film) SW1 including an insulating film, such as a silicon oxide film, are formed on the side walls of the gate electrode GI. The side wall films. SW1 can be formed by depositing an insulating film, such as a silicon oxide film, over the SOI substrate 1 by a CVD method or the like, and then anisotropic etching this insulating film.

Subsequently, using a photoresist film (not shown) having an opening in the upper portion of the drain region as an ion implantation inhibition mask, a first n$^-$-type drain region (first low concentration n-type drain region, first n-type LDD region) 110 is formed by ion implanting n-type impurities, such as phosphorus (P), in a part of the silicon film 7. The first n$^-$-type drain region 110 is formed in a self aligned manner to the side wall films SW1.

Subsequently, using the photoresist film (not shown) in a predetermined shape described above as an ion implantation inhibition mask, a p-type halo region 112 is formed below the n$^-$-type source region 111 by ion implanting p-type impurities, such as boron (B), in the p-type well 107. At this time, the impurities are ion implanted in a direction 30 degrees oblique to the principal surface of the SOI substrate 1. Although this p-type halo region 112 does not necessarily have to be formed, in forming this, the diffusion of impurities from the source region to the channel formation region is inhibited even more, and the short channel effect is inhibited even more. It is possible to inhibit a decline in the threshold voltage even more.

Then, side wall films (side wall insulating film) SW2 including an insulating film, such as a silicon oxide film, are formed on the side walls of the gate electrode GI (side wall films SW1). The side wall films SW2 can be formed by depositing an insulating film, such as a silicon oxide film, over the SOI substrate 1 by a CVD method or the like, and then anisotropic etching this insulating film. Subsequently, using a photoresist film (not shown) having an opening in the upper portion of the drain region as an ion implantation inhibition mask, n-type impurities, such as phosphorus (P), are ion implanted in a part of the first n$^-$-type drain region 110. This forms a second n$^-$-type drain region (second low concentration n-type drain region, second n-type lightly doped drain (LDD) region 113, in a self aligned manner to the side wall films SW1 and SW2 formed on the side walls of the gate electrode GI on the drain side, in a part of the first n$^-$-type drain region 110.

Then, using a photoresist film (not shown) having openings in a part of the second n$^-$-type drain region 113 and the p-type well 107 in the source region as an ion implantation inhibition mask, n-type impurities, such as arsenic (As), are ion implanted in the part of the second n$^-$-type drain region 113 and the p-type well 107 in the source region.

By this ion implantation, in a part of the second n$^-$-type drain region 113, an n$^+$-type drain region (drain high concentration region, high concentration n-type drain region) 114 having a higher impurity concentration than that of the second n$^-$-type drain region 113 and away from the channel formation region further than the second n$^-$-type drain region 113 is formed.

In addition, by this ion implantation method, in the p-type well 107, an n$^+$-type source region 115 is formed that has a higher impurity concentration than that of the n$^-$-type source region 111 and also has a bottom portion at a position deeper than that of the n$^-$-type source region 111. The n$^+$-type source region 115 is formed in a self aligned manner to the side wall films SW2 on the side walls of the gate electrode GI. Therefore, the n$^+$-type source region 115 is formed away from the channel formation region by the distance corresponding to the thicknesses of the side wall films SW1 and SW2 along the direction of the gate length.

By the steps so far, an LDMOS having the drain region including the first n⁻-type drain region 110, the second n⁻-type drain region 113, and the n⁺-type drain region 114, the source region including the n⁻-type source region 111 and the n⁺-type source region 115, and the gate electrode GI is formed in the element region 1I of the SOI substrate 1.

After that, similar to Embodiment 1, an interlayer insulating film 27, plugs P1, first layer wirings M1, and the like are formed over the LDMOS.

The MIS capacitor and the LDMOS can be formed on the thick film region TA2.

Embodiment 4

In accordance with the present embodiment, the following explains an application of the semiconductor devices (semiconductor chips) explained in Embodiments 1 through 3 to electronics. Although electronics to which the semiconductor devices (semiconductor chips) explained in Embodiments 1 through 3 are applied is not limited, the electronics applied to the devices may be a mobile phone (mobile communication device).

Figure 23:
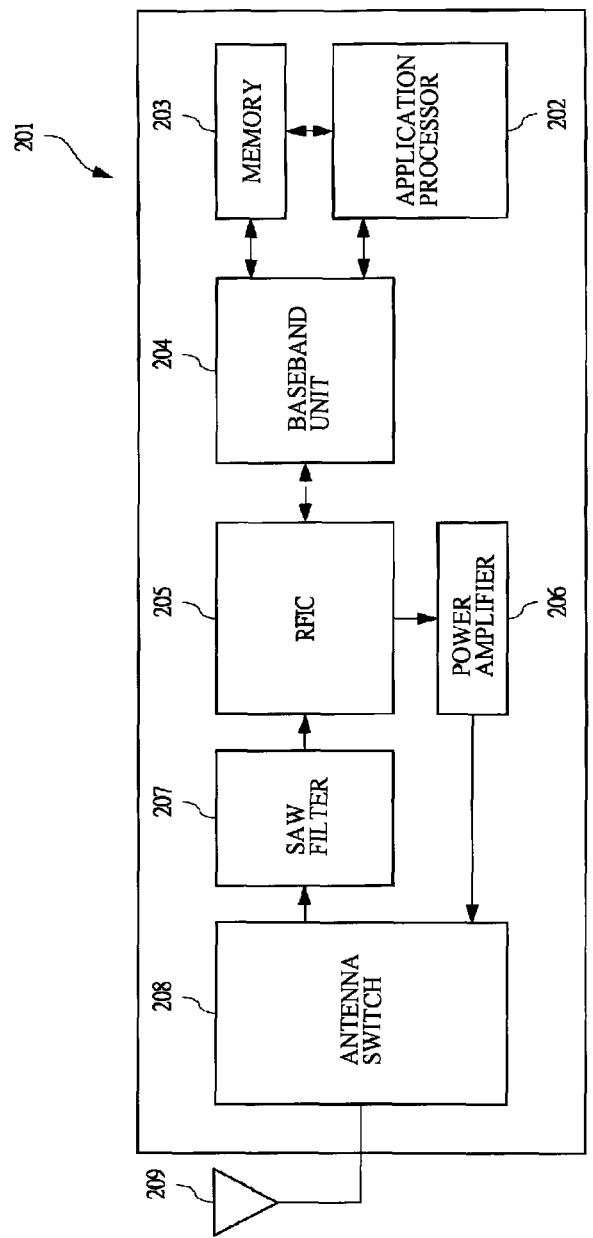
FIG. 23 is a block diagram showing a configuration of a transmission and reception portion of a mobile phone.

FIG. 23 is a block diagram showing a configuration of a transmission and reception portion of a mobile phone. As shown in FIG. 23, a mobile phone 201 has an application processor 202, a memory 203, a baseband unit 204, an RFIC 205, a power amplifier 206, a surface acoustic wave (SAW) filter 207, an antenna switch 208, and an antenna 209.

The application processor 202 includes a central processing unit (CPU), and has a function of realizing an application function of the mobile phone 201. Specifically, it realizes the application function by reading out a command from the memory 203 for decoding and by carrying out various types of operations and controls according to the decoded result. The memory 203 has a function of recording data, and records a program to operate the application processor 202 and data processed in the application processor 202. The memory 203 can access not only the application processor 202 but also the baseband unit 204. The memory 203 can also be used to record data processed in the baseband unit 204.

The baseband unit 204 includes a CPU, which is a central control unit, and allow a baseband signal to be generated by digitally processing an audio signal (analog signal) from a user (caller) via an operation unit at transmission. The baseband unit 204 allows an audio signal to be generated from a baseband signal, which is a digital signal, at reception.

The RFIC 205 allows modulation of a baseband signal to generate a signal at a radio frequency at transmission, and allows demodulation of a received signal to generate a baseband signal at reception. The power amplifier 206 is a semiconductor device to output a high-power signal similar to an extremely low-power input signal by newly generating it with the power supplied from a power source. The SAW filter 207 lets only a signal at a predetermined frequency band pass through among the received signals.

The antenna switch 208 aims to separate a receive signal input to the mobile phone 201 from a transmit signal output from the mobile phone 201. The antenna 209 aims to transmit and receive radio waves.

The mobile phone 201 is configured as above, and its operation is briefly explained below. First, a case of signal transmission is explained. A baseband signal generated by digitally processing an analog signal, such as an audio signal, by the baseband unit 204 is input to the RFIC 205. In the RFIC 205, the input baseband signal is converted into a signal at a radio frequency (RF frequency) by a modulation signal source and a mixer. The signal converted into a radio frequency is output from the RFIC 205 to the power amplifier (RF module) 206. The signal at a radio frequency input to the power amplifier 206 is amplified at the power amplifier 206 and then transmitted from the antenna 209 via the antenna switch 208.

Then, a case of signal reception is explained. A signal (received signal) at a radio frequency received by the antenna 209 passes through the SAW filter 207 via the antenna switch 208, and then input to the RFIC 205. In the RFIC 205, after the input received signal is amplified, frequency conversion is carried out by the modulation signal source and the mixer. Then, the frequency-converted signal is detected and a baseband signal is extracted. After that, this baseband signal is output from the RFIC 205 to the baseband unit 204. This baseband signal is processed at the baseband unit 204 to output an audio signal.

<Configuration of RF Module>

As described above, when a signal is transmitted from the mobile phone 201, the signal is amplified by the power amplifier 206 and then output from the antenna 209 via the antenna switch 208. The power amplifier 206 and the antenna switch 208 are commercialized as an RF module (front-end module) RFM.

Figure 24:
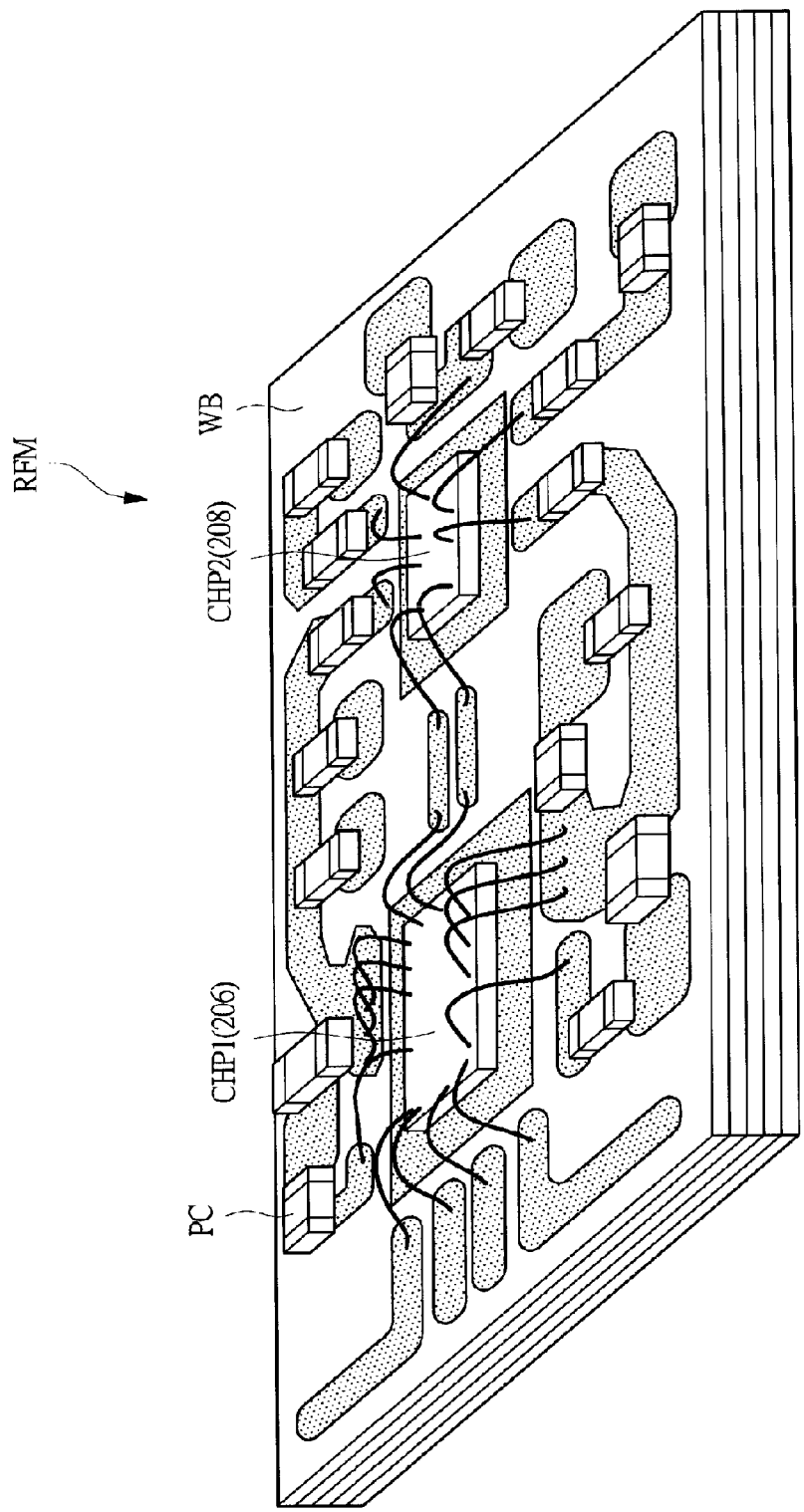
FIG. 24 is a perspective view showing a mounting structure of an RF module of a comparative example in which a power amplifier and an antenna switch are formed with separate semiconductor chips.

FIG. 24 is a perspective view showing a mounting structure of an RF module of a comparative example including a power amplifier and an antenna switch in separate semiconductor chips. In the RF module RFM shown in FIG. 24, a semiconductor chip CHP1, a semiconductor chip CHP2, and a passive component PC are mounted over a wiring board WB. The semiconductor chip CHP1 is a semiconductor chip having an MIS and an LDMOS for high-voltage resistance including the power amplifier 206 formed in. The semiconductor chip CHP2 is semiconductor chip including an MISFET (MISFET for an antenna switch) and the like including an antenna switch formed therein. The passive component PC includes passive elements, such as a resistance element (chip resistor), a capacitive element (chip capacitor), or an inductor element (for example, chip inductor).

The semiconductor chip CHP1 mounted over the wiring board WB is coupled to a conductor pattern with a wire formed over the wiring board WB. Further, this conductor pattern is connected to the passive component PC. Similarly, the semiconductor chip CHP2 mounted over the wiring board WB is connected to the conductor pattern formed over the wiring board WB with a wire. The semiconductor chip CHP1, the semiconductor chip CHP2, and the passive component PC are electrically connected via the conductor pattern to configure the RF module RFM.

In contrast, using the semiconductor devices (semiconductor chips) explained in Embodiments 1 through 3 described above, the power amplifier 206 and the antenna switch 208 can be formed over an identical substrate, so that it is possible to fabricate the semiconductor chip CHP1 and the semiconductor chip CHP2 into one chip.

This enables the mobile phone 201 to be reduced in area and weight. In addition, it is possible to reduce the power consumption and the costs of the mobile phone 201.

In addition, as explained in Embodiment 3, since an MIS capacitor or the like can also be formed over an identical substrate as a capacitive element, it is possible to incorporate a function of the passive component PC described above and the like into the same chip.

Further, the baseband unit 204 and the RFIC 205 explained with reference to FIG. 23 include analog circuits, and in addition to the power amplifier 206 and the antenna switch 208, these circuits can also be fabricated into one chip. Furthermore, the memory 203 and the application processor 202 can also be formed within the same chip, and it becomes possible to fabricate the configuration, in the circuit shown in FIG. 23, other than the SAW filter into one chip.

While the present invention made by the present inventor has bee specifically explained above based on the embodiments, the present invention is not limited to the embodiments described above and it is obvious that various modifications can be made without departing from the spirit.

The present invention relates to a semiconductor device, and in particular relates to a technique effective to be applied to a semiconductor device having semiconductor elements formed in semiconductor layers having different thicknesses.

What is claimed is:

1. A semiconductor device, comprising:
   a first element region, a second element region, and a first isolation region including a first insulating film isolating between the first element region and the second element region;
   a third element region, a fourth element region, and a second isolation region including a second insulating film isolating between the third element region and the fourth element region; and
   a fifth element region between the second element region and the fourth element region, and a third isolation region including a third insulating film isolating between the fifth element region and the fourth element region, wherein:
   the first element region and the second element region have a first semiconductor film with a first film thickness disposed over a fourth insulating film;
   the third element region, the fourth element region, and the fifth element region have a second semiconductor film with a second film thickness thicker than the first film thickness disposed over the fourth insulating film; and
   the third insulating film is thicker than the first insulating film and thinner than the second insulating film.

2. The semiconductor device according to claim 1, wherein the second semiconductor film is a laminated film of the first semiconductor film and a third semiconductor film over the first semiconductor film.

3. The semiconductor device according to claim 2, wherein the third insulating film is a laminated film of the first insulating film and the second insulating film over the first insulating film.

4. The semiconductor device according to claim 2, wherein the third semiconductor film in the fifth element region has an insulating side wall film on a side wall thereof.

5. The semiconductor device according to claim 1, wherein the first element region and the second element region have MISFETs in which an impurity region constituting source and drain regions reaches the fourth insulating film.

6. The semiconductor device according to claim 1, wherein the third element region and the fourth element region have MISFETs in which an impurity region constituting source and drain regions does not reach the fourth insulating film.

7. The semiconductor device according to claim 6, wherein the fifth element region has a MISFET in which an impurity region constituting source and drain regions does not reach the fourth insulating film.

* * * * *